(12) United States Patent
Eum et al.

(10) Patent No.: US 12,228,861 B2
(45) Date of Patent: Feb. 18, 2025

(54) APPARATUS FOR TREATING SUBSTRATE

(71) Applicant: SEMES CO., LTD., Cheonan-si (KR)

(72) Inventors: Ki Sang Eum, Cheonan-si (KR); Jin Ho Choi, Incheon (KR); Sun Wook Jung, Hwaseong-si (KR); Byoung Doo Choi, Cheonan-si (KR); Hee Man Ahn, Seoul (KR); Si Eun Kim, Cheongju-si (KR)

(73) Assignee: SEMES Co., Ltd., Cheonan-si (KR)

( * ) Notice: Subject to any disclaimer, the term of this patent is extended or adjusted under 35 U.S.C. 154(b) by 284 days.

(21) Appl. No.: 17/522,007

(22) Filed: Nov. 9, 2021

(65) Prior Publication Data
US 2022/0163891 A1    May 26, 2022

(30) Foreign Application Priority Data
Nov. 23, 2020   (KR) .......................... 10-2020-0157857

(51) Int. Cl.
*G03F 7/16*       (2006.01)
*C23C 16/458*    (2006.01)

(52) U.S. Cl.
CPC .......... *G03F 7/162* (2013.01); *C23C 16/4584* (2013.01)

(58) Field of Classification Search
CPC ..... C23C 16/4584; C23C 16/52; G03F 7/162; B05C 11/08; H01L 21/02282; H01L 2224/03416; H01L 2224/11416; H01L 2224/27416; H01L 2224/75181; H01L 2224/77181; H01L 2224/79181
See application file for complete search history.

(56) References Cited

U.S. PATENT DOCUMENTS

| 6,527,860 B1* | 3/2003 | Yoshihara | ........... H01L 21/6715 118/62 |
|---|---|---|---|
| 2004/0180142 A1* | 9/2004 | Kobayashi | .......... H01L 21/6715 118/52 |
| 2007/0175394 A1* | 8/2007 | Inagaki | ................... C30B 29/16 118/725 |
| 2009/0158932 A1* | 6/2009 | Arnold | .................. B04C 5/081 95/271 |

FOREIGN PATENT DOCUMENTS

| JP | 2000-237669 A | 9/2000 |
|---|---|---|
| JP | 2002-025969 A | 1/2002 |

(Continued)

OTHER PUBLICATIONS

Japanese Office Action dated Oct. 25, 2022 issued in Japanese Patent Application No. 2021-189634.

(Continued)

*Primary Examiner* — Dah-Wei D. Yuan
*Assistant Examiner* — Stephen A Kitt
(74) *Attorney, Agent, or Firm* — Harness, Dickey & Pierce, P.L.C.

(57) ABSTRACT

An apparatus for treating a substrate includes a treating vessel having an inner space, a support unit that supports and rotates the substrate in the inner space, and an exhaust unit that releases an air flow in the inner space. The exhaust unit includes an air-flow guide duct into which the air flow is introduced in a tangential direction with respect to a rotating direction of the substrate supported on the support unit.

8 Claims, 24 Drawing Sheets

(56) References Cited

FOREIGN PATENT DOCUMENTS

| | | |
|---|---|---|
| JP | 2002-066428 A | 3/2002 |
| JP | 2012-134390 A | 7/2012 |
| JP | 2015-088734 A | 5/2015 |
| JP | 2016-149480 A | 8/2016 |
| KR | 10-1999-0077743 A | 10/1999 |
| KR | 100574303 B1 | 4/2006 |
| KR | 10-2009-0056805 A | 6/2009 |
| WO | WO-2012/047034 A2 | 4/2012 |

OTHER PUBLICATIONS

Korean Office Action dated Oct. 27, 2022 issued in corresponding Korean Patent Application No. 10-2020-0157857.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2020-0157857 filed on Nov. 23, 2020, in the Korean Intellectual Property Office, the entire contents of which are hereby incorporated by reference.

BACKGROUND

Embodiments of the inventive concept described herein relate to an apparatus for treating a substrate, and more particularly, relate to an apparatus for treating a substrate by dispensing a liquid onto the rotating substrate.

Various processes, such as cleaning, deposition, photolithography, etching, ion implantation, and the like, are performed to manufacture semiconductor devices. Among these processes, the photolithography process includes a coating process of forming a film by applying a light-sensitive liquid, such as photoresist, to a surface of a substrate, an exposure process of transferring a circuit pattern to the film formed on the substrate, and a developing process of selectively removing the film formed on the substrate from the region exposed to light or the region not exposed to light.

FIG. 1 is a schematic view illustrating a substrate treating apparatus 1 for applying photoresist to a substrate. Referring to FIG. 1, the substrate treating apparatus 1 includes a treating vessel 10 having an inner space, a support unit 20 for supporting the substrate W in the inner space, and a nozzle 30 for dispensing a treating liquid 82 onto the substrate W placed on the support unit 20. The treating vessel 10 has an outer cup 12 and an inner cup 14. Furthermore, a fan filter unit (not illustrated) for supplying a downward air flow into the inner space is disposed over the treating vessel 10, and a drain tube 60 for draining the treating liquid and an exhaust tube 70 for releasing an atmosphere in a treating space are connected to a lower region of the inner space.

When the substrate treating apparatus 1 having the structure illustrated in FIG. 1 treats the substrate W while dispensing the treating liquid 82 on the rotating substrate W, the air flow 84 on the surface of the substrate W flows from the center of the substrate W toward the edge thereof along the rotating direction of the substrate W by the centrifugal force as illustrated in FIG. 2. Thereafter, as illustrated in FIG. 3, the air flow 84 flows downward after colliding with the outer cup 12 and is released from the inner space to the outside through the exhaust tube 70. As the direction of the air flow 84 is changed from the horizontal direction to the vertical direction, the air flow 84 collides with the outer cup 12, and a vortex is generated at the point where the air flow 84 collides with the outer cup 12. The air flow 84 is stagnant at the point where the vortex is generated, and the inner space is not smoothly evacuated accordingly. The problem is further intensified as the rotating speed of the substrate W is increased.

The vortex and the stagnant air flow at the collision point hamper the air flow over the edge region of the substrate W when a film of the treating liquid 82 is formed on the substrate W. Due to this, the thickness of the thin film on the edge region of the substrate W is greater than the thickness of the thin film on the central region of the substrate W. Furthermore, due to the vortex at the collision point, contaminants such as fumes flow back to the substrate W to contaminate the substrate W.

SUMMARY

Embodiments of the inventive concept provide a substrate treating apparatus for improving efficiency in treating a substrate.

Embodiments of the inventive concept provide a substrate treating apparatus for smoothly releasing an air flow in a treating space when treating a substrate by dispensing a treating liquid onto the rotating substrate in the treating space.

Embodiments of the inventive concept provide a substrate treating apparatus for forming a liquid film having a uniform thickness on the entire region of a substrate by dispensing a treating liquid onto the rotating substrate.

Embodiments of the inventive concept provide a substrate treating apparatus for preventing re-adsorption of contaminants to a substrate when treating the substrate by dispensing a treating liquid onto the rotating substrate.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for treating a substrate includes a treating vessel having an inner space, a support unit that supports and rotates the substrate in the inner space, and an exhaust unit that releases an air flow in the inner space. The exhaust unit includes an air-flow guide duct into which the air flow is introduced in a tangential direction with respect to a rotating direction of the substrate supported on the support unit.

The air-flow guide duct may have a helical shape. The air-flow guide duct may gradually curve downward from an inlet to an outlet thereof around and along an axis of rotation of the substrate while maintaining the same distance from the axis of rotation of the substrate.

The support unit may include a support plate that supports the substrate, a rotary shaft that rotates the support plate, and an actuator that is coupled to the rotary shaft and that provides torque to the rotary shaft. The treating vessel may include an outer cup that provides the inner space and an inner cup that is disposed in the inner space so as to be spaced apart from the outer cup and that surrounds the rotary shaft or the actuator. The air-flow guide duct may be provided between the outer cup and the inner cup.

A guide plate in a helical shape may be provided between the outer cup and the inner cup, and the air-flow guide duct may be defined by the outer cup, the inner cup, and the guide plate.

The guide plate may be downwardly inclined in a direction away from the rotary shaft, and a liquid-drain hole may be formed in a region of the guide plate adjacent to the outer cup.

The inner cup may define, in the inner space, an exhaust space to which an exhaust tube is coupled, and the air flow flowing out of the air-flow guide duct may be introduced into the exhaust space and released from the treating vessel.

A gas-liquid separator extending upward from a bottom wall of the outer cup may be provided between the outer cup and the inner cup, and the air-flow guide duct may release the air flow into a space between the outer cup and the gas-liquid separator.

The air-flow guide duct may include an introduction part having an inlet, and the introduction part of the air-flow guide duct, which has the inlet, may be disposed to extend outside the treating vessel through an outer wall of the treating vessel.

The introduction part may be provided such that a lengthwise direction thereof is parallel to a tangential direction of the substrate supported on the support unit.

The support unit may have a rotatable support plate on which the substrate is placed. An exhaust space may be defined in a region under the support plate in the inner space. The exhaust unit may further include a separate exhaust tube that releases, outside the inner space, the air flow introduced into the exhaust space. The separate exhaust tube and the air-flow guide duct may be connected to an integrated exhaust tube to which a pressure adjustment member is connected.

The air-flow guide duct may be located in the inner space of the treating vessel. The air-flow guide duct may be mounted on an inner wall of the treating vessel.

The air-flow guide duct may be provided such that a lengthwise direction thereof is parallel to an up/down direction. The air-flow guide duct may include an upper wall and a sidewall. The upper wall may serve as a blocking face. An inlet through which the air flow is introduced may be formed in a face of the sidewall facing a direction parallel to a tangent line of the substrate supported on the support unit, and a remaining face may serve as a blocking face.

The apparatus may further include a fan unit that supplies a downward air flow into the inner space and a nozzle that dispenses a treating liquid onto the substrate supported on the support unit.

The air-flow guide duct may include a plurality of air-flow guide ducts spaced apart from each other along a circumferential direction of the substrate supported on the support unit.

According to an embodiment, an apparatus for treating a substrate includes a treating vessel having an inner space, a support unit having a support plate that supports and rotates the substrate in the inner space, and an exhaust unit that releases an atmosphere in the inner space. The exhaust unit includes an exhaust tube that releases, outside the treating vessel, an air flow introduced into an exhaust space along a first path through a space between an inner wall of the treating vessel and the substrate supported on the support plate, the exhaust space being located under the support plate in the inner space, and an air-flow guide duct that guides the air flow along a second path different from the first path.

The second path may be a path in a tangential direction with respect to a rotating direction of the substrate supported on the support unit.

The support unit may include a rotary shaft that rotates the support plate and an actuator that is coupled to the rotary shaft and that provides torque to the rotary shaft. The treating vessel may include an outer cup that provides the inner space and an inner cup that is disposed in the inner space so as to be spaced apart from the outer cup and that surrounds the rotary shaft or the actuator. The air-flow guide duct may be provided between the outer cup and the inner cup.

According to an embodiment, an apparatus for treating a substrate includes a treating vessel having an inner space, a support unit having a support plate that supports and rotates the substrate in the inner space, and an air-flow guide duct that guides a flow direction of an air flow flowing outside the substrate by rotation of the substrate supported on the support plate. An inlet of the air-flow guide duct through which the air flow is introduced is provided at the same height as the substrate supported on the support plate or at a height adjacent to the substrate supported on the support plate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
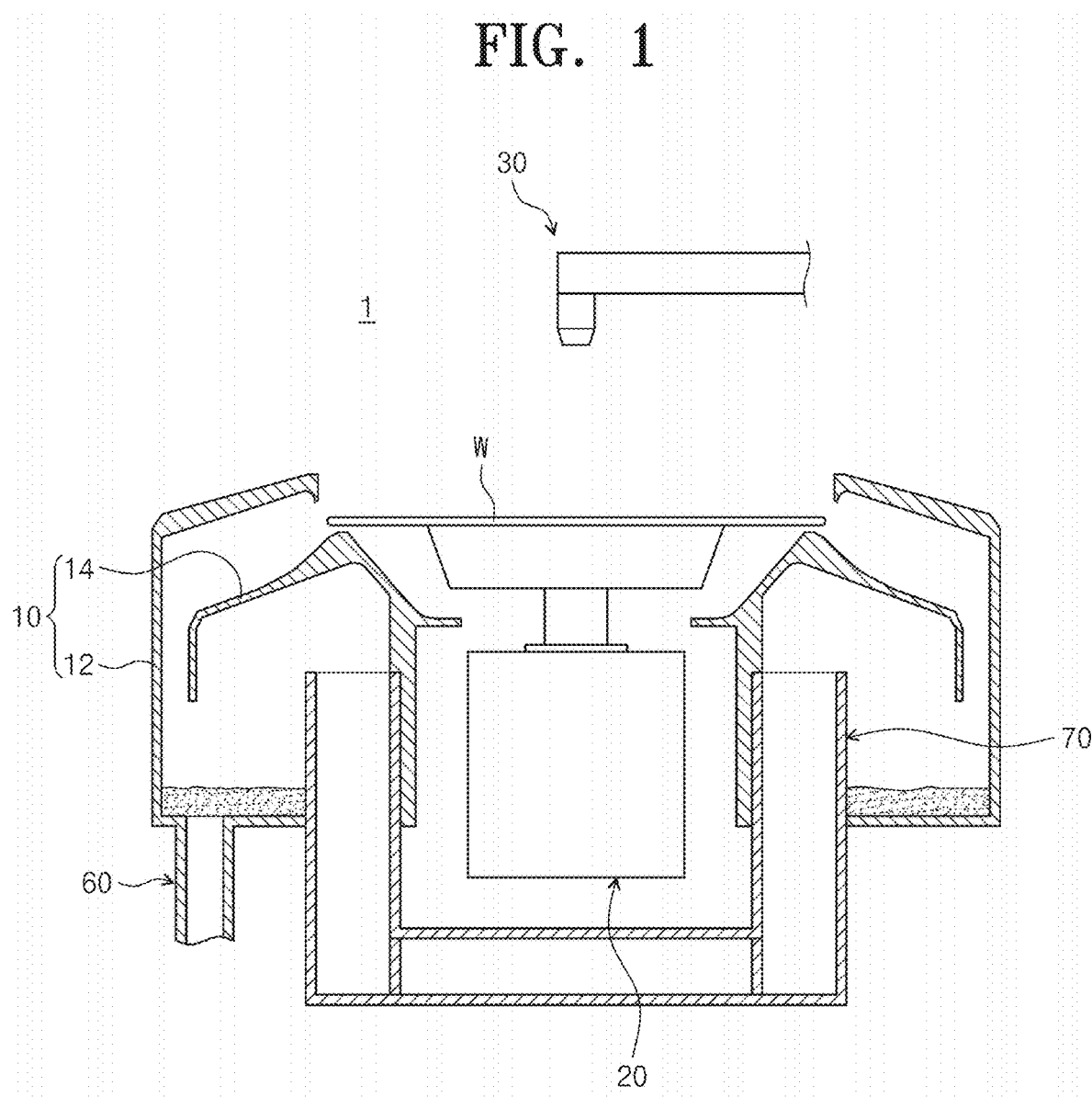
FIG. 1 is a sectional view illustrating a substrate treating apparatus having a general structure for performing liquid treatment on a substrate while rotating the substrate.
Figure 2:
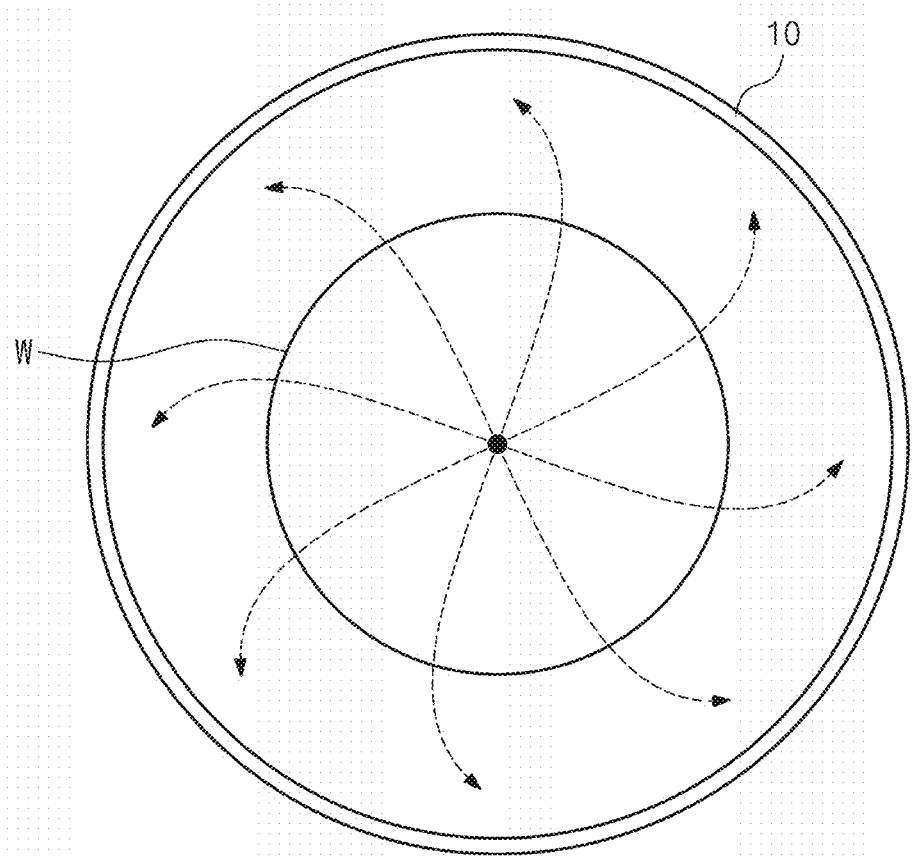
FIG. 2 is a plan view illustrating a direction of an air flow on a surface of the substrate in the substrate treating apparatus of FIG. 1.
Figure 3:
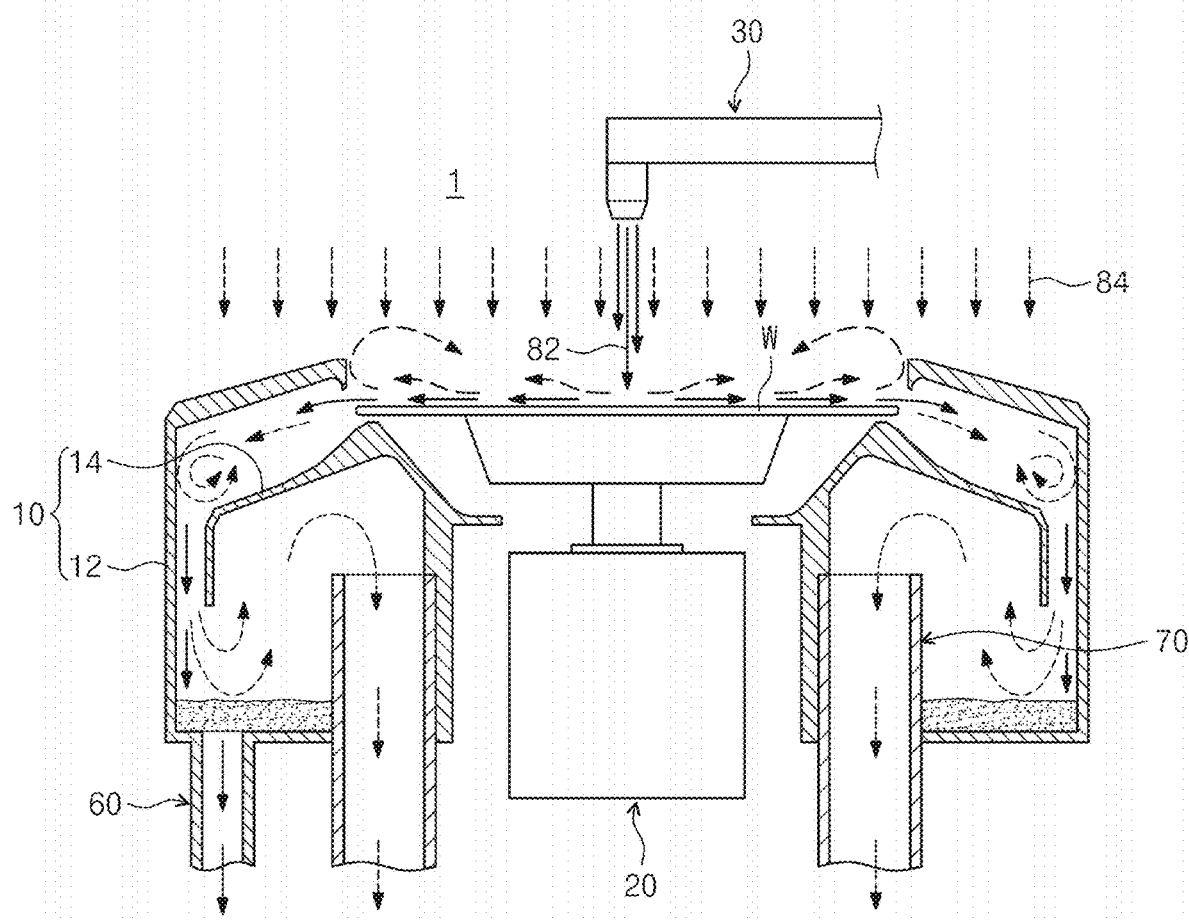
FIG. 3 is a sectional view illustrating the air flow in the substrate treating apparatus of FIG. 1.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated and reduced for clarity of illustration.

An apparatus of this embodiment may be used to perform a photolithography process on a circular substrate. In particular, the apparatus of this embodiment may be connected to an exposure apparatus and may be used to perform a coating process and a developing process on a substrate. However, the spirit and scope of the inventive concept is not limited thereto, and the apparatus may be used to perform various types of processes of dispensing a treating liquid onto a substrate while rotating the substrate. In the following description, it will be exemplified that a wafer is used as a substrate.

Hereinafter, embodiments of the inventive concept will be described with reference to FIGS. 4 to 18.

Figure 4:
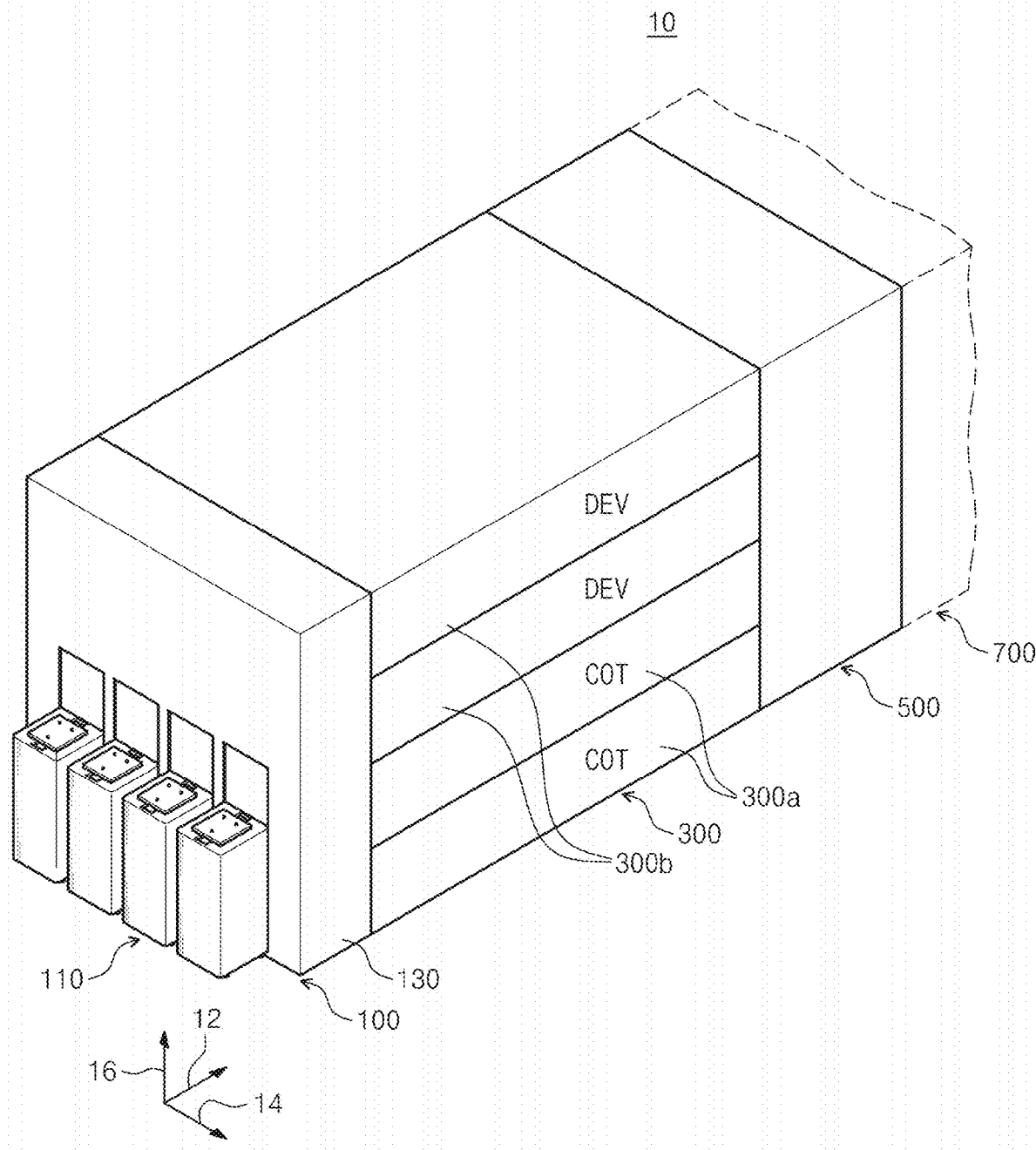
FIG. 4 is a schematic perspective view illustrating a substrate treating apparatus according to an embodiment of the inventive concept.
Figure 5:
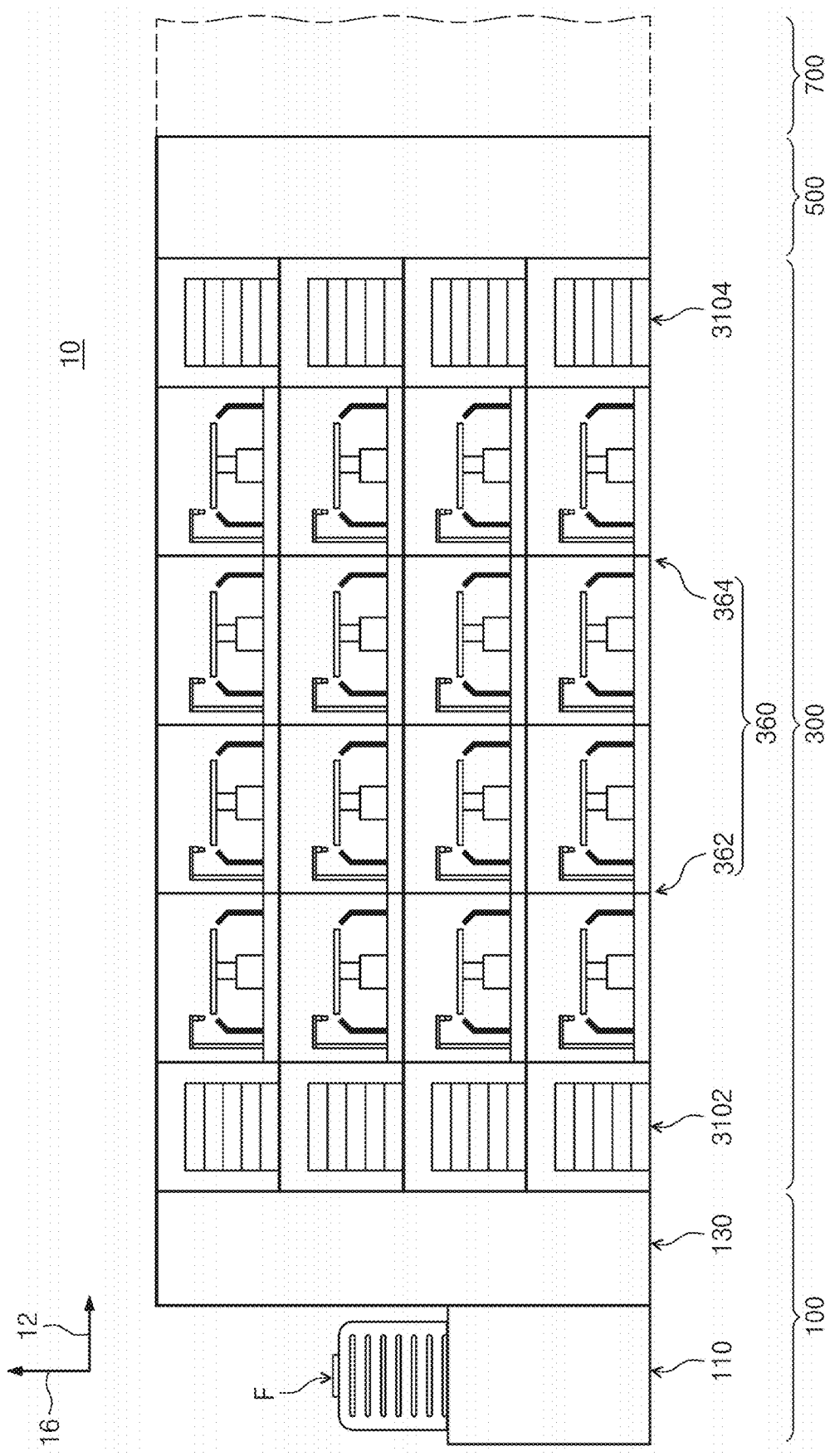
FIG. 5 is a sectional view of the substrate treating apparatus illustrating coating blocks and developing blocks of FIG. 4.
Figure 6:
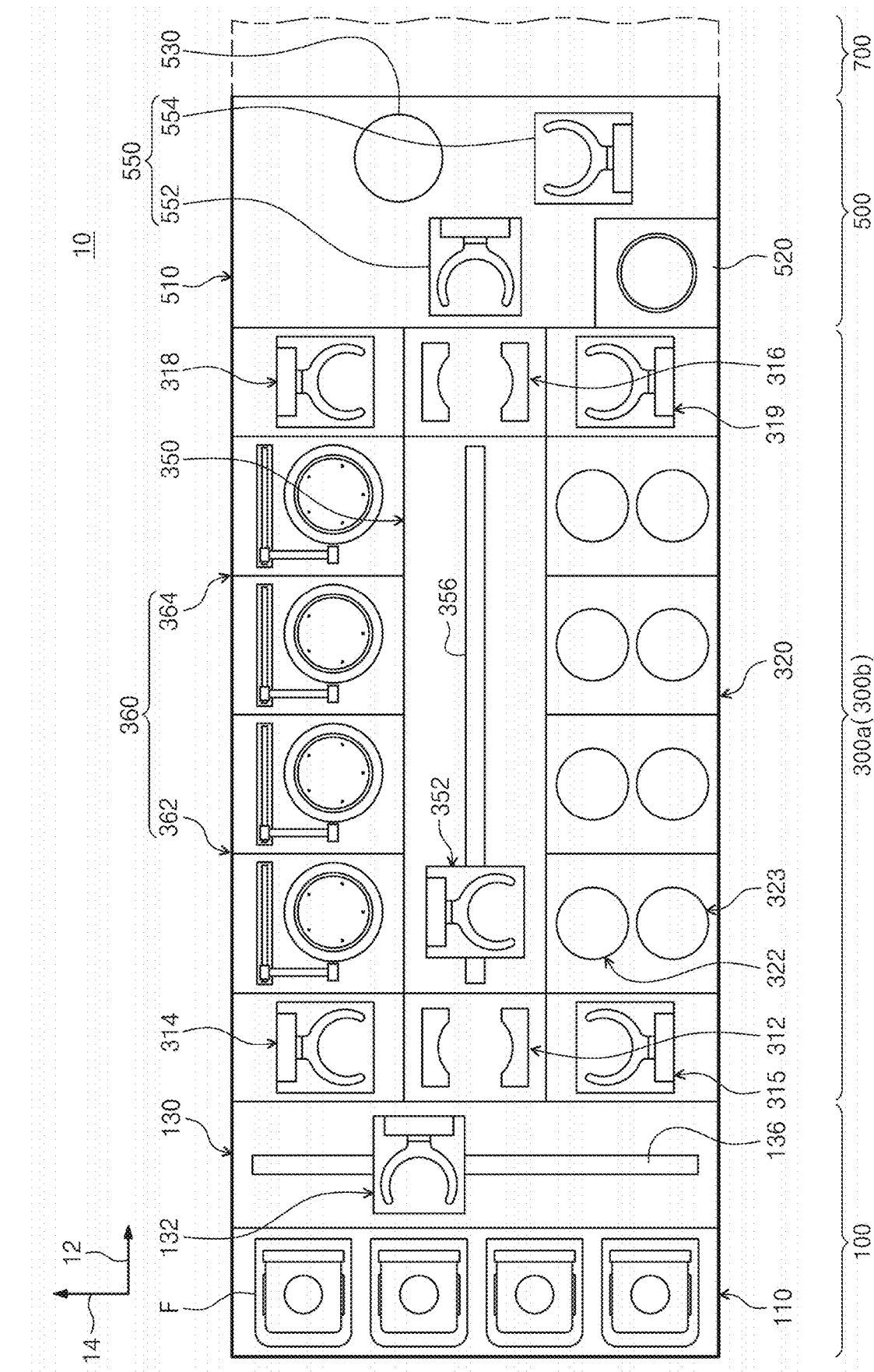
FIG. 6 is a plan view of the substrate treating apparatus of FIG. 4.

FIG. 4 is a schematic perspective view illustrating a substrate treating apparatus according to an embodiment of the inventive concept. FIG. 5 is a sectional view of the substrate treating apparatus illustrating coating blocks and developing blocks of FIG. 4. FIG. 6 is a plan view of the substrate treating apparatus of FIG. 4.

Referring to FIGS. 4 to 6, the substrate treating apparatus 10 according to the embodiment of the inventive concept includes an index module 100, a treating module 300, and an interface module 500. According to an embodiment, the index module 100, the treating module 300, and the interface module 500 are sequentially disposed in a row. Hereinafter, a direction in which the index module 100, the treating module 300, and the interface module 500 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 100 transfers substrates W from a carrier F having the substrates W accommodated therein to the treating module 300 and places the substrates W treated in the treating module 300 in the carrier F. The index module 100 is disposed such that the lengthwise direction thereof is parallel to the second direction 14. The index module 100 has a load port 110 and an index frame 130. The load port 110 is located on the opposite side to the treating module 300 with respect to the index frame 130. The carrier F having the substrates W accommodated therein is placed on the load port 110. A plurality of load ports 110 may be provided. The plurality of load ports 110 may be disposed in the second direction 14.

An airtight carrier F such as a front open unified pod (FOUP) may be used as the carrier F. The carrier F may be placed on the load port 110 by a transfer unit (not illustrated), such as an overhead transfer, an overhead conveyor, or an automatic guided vehicle, or by an operator.

An index robot 132 is provided in the index frame 130. A guide rail 136, the lengthwise direction of which is parallel to the second direction 14, is provided in the index frame 130. The index robot 132 is movable on the guide rail 136. The index robot 132 includes a hand on which a substrate W is placed. The hand is movable forward and backward, rotatable about an axis facing the third direction 16, and movable along the third direction 16.

The treating module 300 may perform a coating process and a developing process on the substrates W. The treating module 300 may receive the substrates W accommodated in the carrier F and may perform a substrate treating process on the substrates W. The treating module 300 has the coating blocks 300a and the developing blocks 300b. The coating blocks 300a perform the coating process on the substrates W, and the developing blocks 300b perform the developing process on the substrates W. The coating blocks 300a are stacked on each other. The developing blocks 300b are stacked on each other. According to the embodiment of FIG. 4, two coating blocks 300a and two developing blocks 300b are provided. The coating blocks 300a may be disposed under the developing blocks 300b. According to an embodiment, the two coating blocks 300a may perform the same process and may have the same structure. Furthermore, the two developing blocks 300b may perform the same process and may have the same structure.

Referring to FIG. 6, each of the coating blocks 300a has heat treatment chambers 320, a transfer chamber 350, liquid treatment chambers 360, and buffer chambers 312 and 316. The heat treatment chambers 320 perform a heat treatment process on the substrates W. The heat treatment process may include a cooling process and a heating process. The liquid treatment chambers 360 form liquid films on the substrates W by dispensing a liquid onto the substrates W. The liquid films may be photoresist films or anti-reflection films. The transfer chamber 350 transfers the substrates W between the heat treatment chambers 320 and the liquid treatment chambers 360 in the coating block 300a.

The transfer chamber 350 is disposed such that the lengthwise direction thereof is parallel to the first direction 12. A transfer robot 352 is provided in the transfer chamber 350. The transfer robot 352 transfers the substrates W between the heat treatment chambers 320, the liquid treatment chambers 360, and the buffer chambers 312 and 316. According to an embodiment, the transfer robot 352 includes a hand on which a substrate W is placed. The hand is movable forward and backward, rotatable about an axis facing the third direction 16, and movable along the third direction 16. A guide rail 356, the lengthwise direction of which is parallel to the first direction 12, is provided in the transfer chamber 350, and the transfer robot 352 is movable on the guide rail 356.

Figure 7:
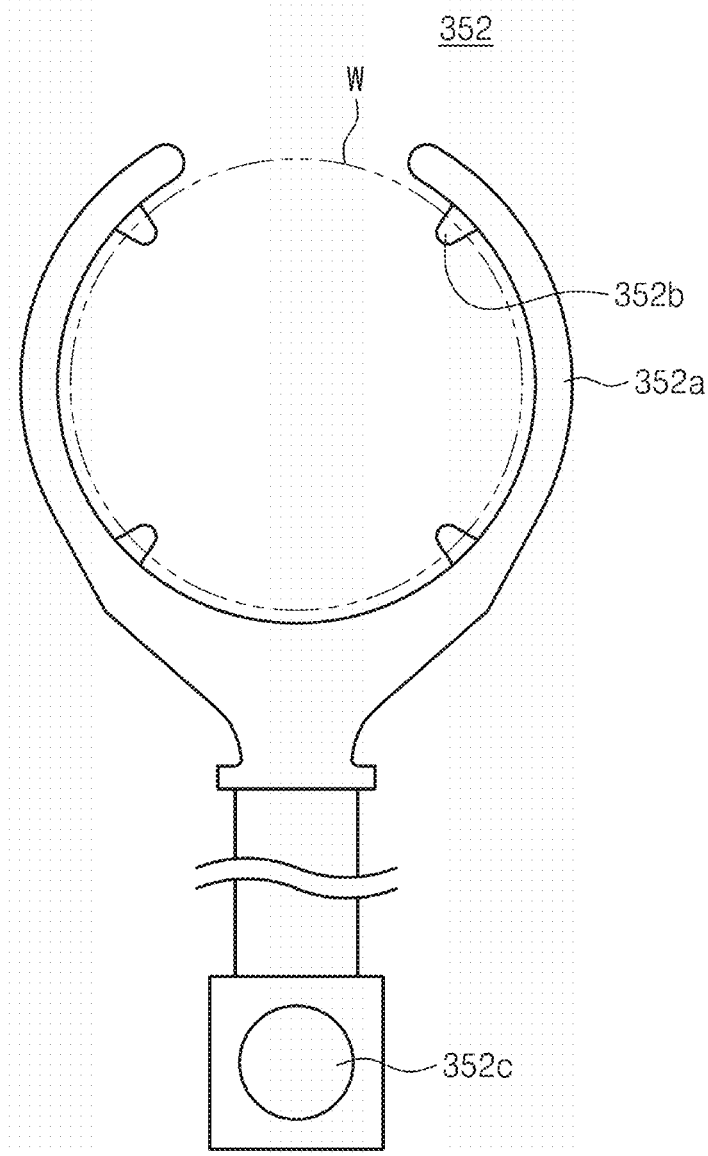
FIG. 7 is a schematic plan view illustrating a transfer robot of FIG. 6.

FIG. 7 is a view illustrating one example of the hand of the transfer robot. Referring to FIG. 7, the hand 352 has a base 352a and support protrusions 352b. The base 352a may have an annular ring shape, the circumference of which is partly curved. The base 352a has an inner diameter larger than the diameter of a substrate W. The support protrusions 352b extend inward from the base 352a. The support protrusions 352 support an edge region of the substrate W. According to an embodiment, four support protrusions 352 may be provided at equal intervals.

The heat treatment chambers 320 are arranged along the first direction 12. The heat treatment chambers 320 are located on one side of the transfer chamber 350.

Figure 8:
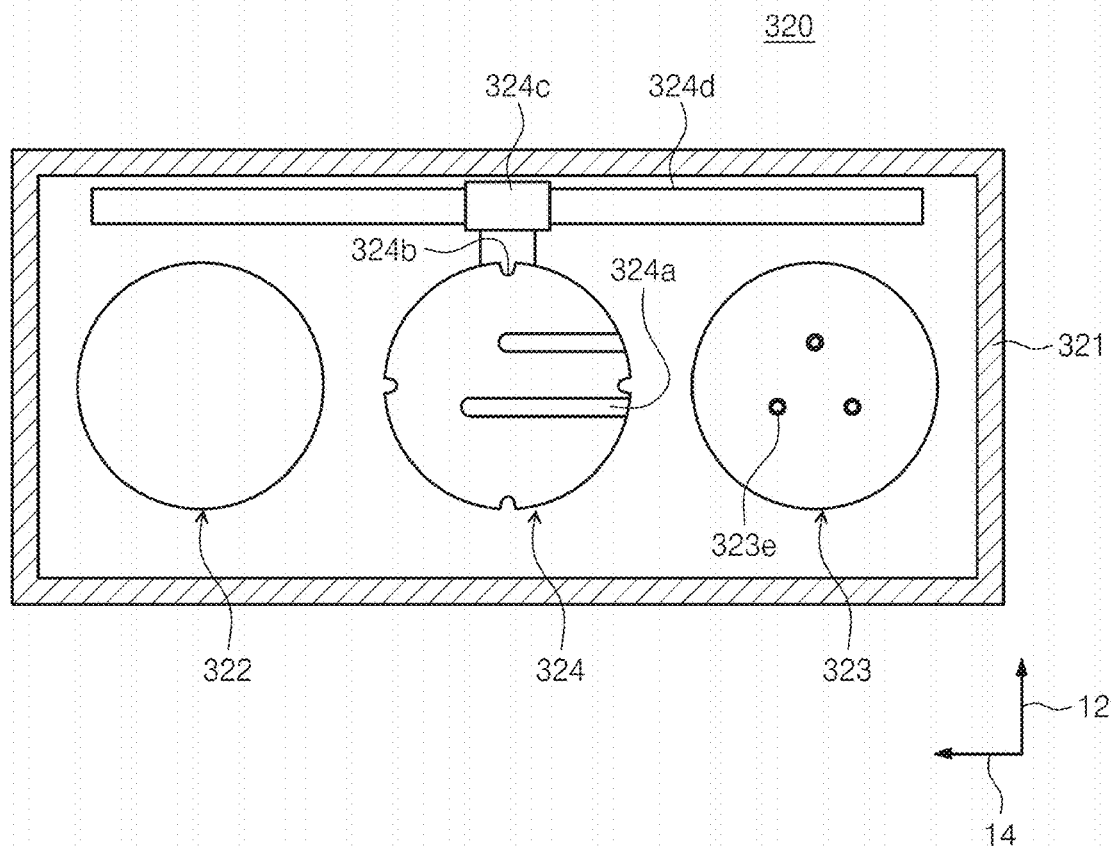
FIG. 8 is a schematic plan view illustrating one example of heat treatment chambers of FIG. 6.
Figure 9:
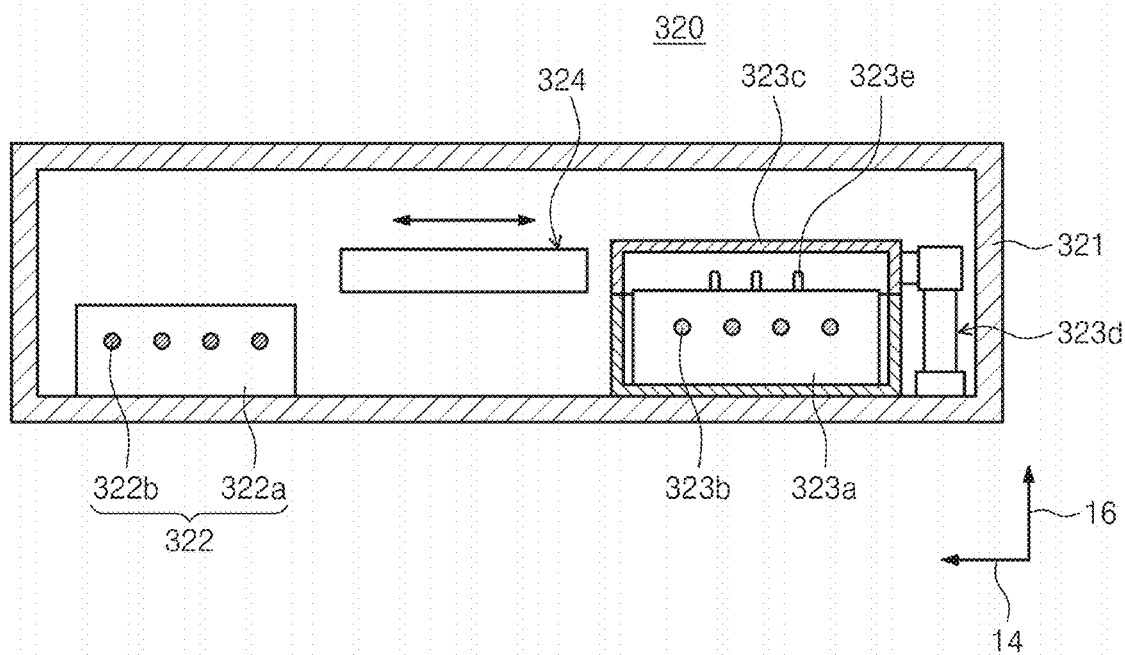
FIG. 9 is a front view of the heat treatment chamber of FIG. 8.

FIG. 8 is a schematic plan view illustrating one example of the heat treatment chambers of FIG. 6, and FIG. 9 is a front view of the heat treatment chamber of FIG. 8.

Referring to FIGS. 8 and 9, the heat treatment chamber 320 has a housing 321, a cooling unit 322, a heating unit 323, and a transfer plate 324.

The housing 321 has a substantially rectangular parallelepiped shape. The housing 321 has, in a sidewall thereof, an entrance/exit opening (not illustrated) through which a substrate W enters and exits the housing 321. The entrance/exit opening may remain open. Selectively, a door (not illustrated) may be provided to open and close the entrance/exit opening. The cooling unit 322, the heating unit 323, and the transfer plate 324 are provided in the housing 321. The cooling unit 322 and the heating unit 323 are provided side by side along the second direction 14. According to an embodiment, the cooling unit 322 may be located closer to the transfer chamber 350 than the heating unit 323.

The cooling unit 322 has a cooling plate 322a. The cooling plate 322a may have a substantially circular shape when viewed from above. A cooling member 322b is provided inside the cooling plate 322a. According to an embodiment, the cooling member 322b may be formed inside the cooling plate 322a and may serve as a fluid channel through which a cooling fluid flows.

The heating unit 323 has a heating plate 323a, a cover 323c, and a heater 323b. The heating plate 323a has a substantially circular shape when viewed from above. The heating plate 323a has a larger diameter than the substrate W. The heater 323b is installed inside the heating plate 323a. The heater 323b may be implemented with a resistance heating element to which an electric current is applied. The heating plate 323a has lift pins 323e vertically movable along the third direction 16. The lift pins 323e receive the substrate W from a transfer unit outside the heating unit 323 and lay the substrate W down on the heating plate 323a, or raise the substrate W off the heating plate 323a and transfer the substrate W to the transfer unit outside the heating unit 323. According to an embodiment, three lift pins 323e may be provided. The cover 323c has a space therein, which is open at the bottom. The cover 323c is located over the heating plate 323a and is vertically moved by an actuator 323d. A space that the cover 323c is moved to form together with the heating plate 323a serves as a heating space in which the substrate W is heated.

The transfer plate 324 has a substantially circular plate shape and has a diameter corresponding to that of the substrate W. The transfer plate 324 has notches 324 formed at the edge thereof. The notches 324 may have a shape corresponding to the support protrusions 352b formed on the hand of the transfer robot 352 described above. Furthermore, as many notches 324b as the support protrusions 352b formed on the hand are formed in positions corresponding to the support protrusions 352b. The substrate W is transferred between the hand and the transfer plate 324 when the vertical positions of the hand and the transfer plate 324 aligned with each other in the vertical direction are changed. The transfer plate 324 is mounted on a guide rail 324d and moved along the guide rail 324d by an actuator 324c. The transfer plate 324 has a plurality of guide grooves 324a in a slit shape. The guide grooves 324a extend inward from the edge of the transfer plate 324. The lengthwise direction of the guide grooves 324a is parallel to the second direction 14, and the guide grooves 324a are located to be spaced apart from each other in the first direction 12. The guide grooves 324a prevent the transfer plate 324 and the lift pins 323e from interfering with each other when the substrate W is transferred between the transfer plate 324 and the heating unit 323.

The substrate W is cooled in a state in which the transfer plate 324 having the substrate W placed thereon is brought into contact with the cooling plate 322a. For efficient heat transfer between the cooling plate 322a and the substrate W, the transfer plate 324 is formed of a material having high heat conductivity. According to an embodiment, the transfer plate 324 may be formed of a metallic material.

The heating units 323 provided in some of the heat treatment chambers 320 may improve adhesion of photoresist to the substrate W by supplying a gas while heating the substrate W. According to an embodiment, the gas may be a hexamethyldisilane (HMDS) gas.

Some of the liquid treatment chambers 360 may be stacked on each other. The liquid treatment chambers 360 are located on one side of the transfer chamber 350. The liquid treatment chambers 360 are arranged side by side along the first direction 12. Some of the liquid treatment chambers 360 are located adjacent to the index module 100. Hereinafter, these liquid treatment chambers 360 are referred to as front liquid treatment chambers 362. Other liquid treatment chambers 360 are located adjacent to the interface module 500. Hereinafter, these liquid treatment chambers 360 are referred to as rear liquid treatment chambers 364.

Each of the front liquid treatment chambers 362 applies a first liquid to the substrate W, and each of the rear liquid treatment chambers 364 applies a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Selectively, the first liquid may be photoresist, and the second liquid may be an anti-reflection film. In this case, the anti-reflection film may be applied to the substrate W coated with the photoresist. Selectively, the first liquid and the second liquid may be of the same type. Both the first liquid and the second liquid may be photoresist.

Hereinafter, a structure of a substrate treating apparatus for treating a substrate by dispensing a treating liquid onto the rotating substrate among substrate treating apparatuses of the inventive concept will be described in detail. It will be exemplified that the substrate treating apparatus is an apparatus for applying photoresist. However, the substrate treating apparatus may be an apparatus for forming a film, such as a protective film or an anti-reflection film, on a rotating substrate W. Selectively, the substrate treating apparatus may be an apparatus for dispensing a treating liquid 82, such as a developing solution, onto a substrate W.

Figure 10:
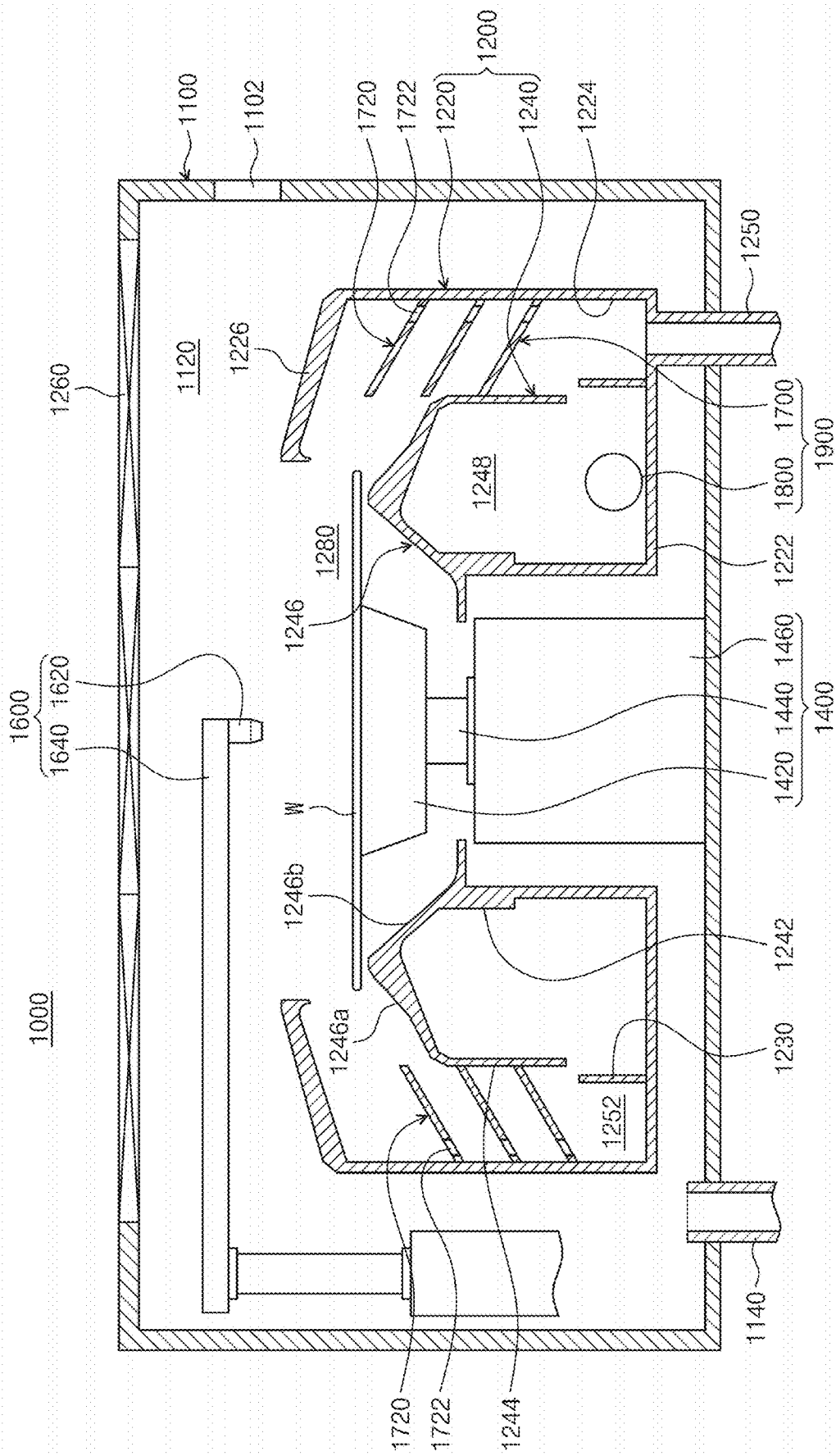
FIG. 10 is a schematic sectional view illustrating a structure of a substrate treating apparatus for treating a substrate by dispensing a liquid onto the rotating substrate according to a first embodiment of the inventive concept.
Figure 11:
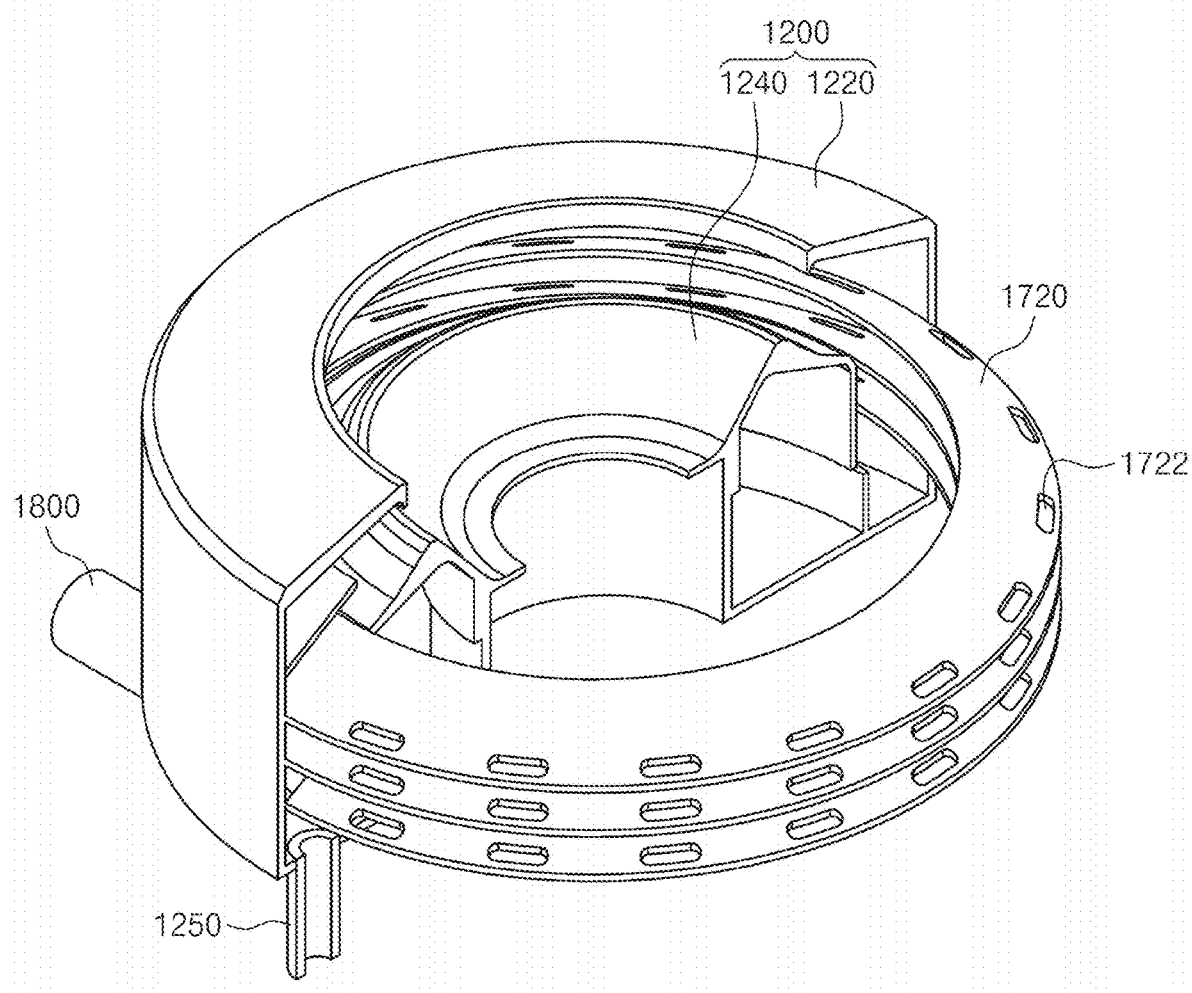
FIG. 11 is a perspective view of the substrate treating apparatus of FIG. 10.

FIG. 10 is a sectional view illustrating one embodiment of the substrate treating apparatus for treating a substrate by dispensing a treating liquid onto the rotating substrate, and FIG. 11 is a perspective view of the substrate treating apparatus of FIG. 10.

Referring to FIGS. 10 and 11, the substrate treating apparatus includes a housing 1100, a treating vessel 1200, a substrate support unit 1400, a liquid dispensing unit 1600, and an exhaust unit 1900.

The housing 1100 is provided in a rectangular parallelepiped container shape having an inner space 1120. An opening 1102 is formed in a sidewall of the housing 1100. The opening 1102 functions as a passage through which the substrate W enters and exits the housing 1100. A door (not illustrated) is provided on the sidewall of the housing 1100 and opens and closes the opening 1102.

The treating vessel 1200 is provided in the inner space 1120 of the housing 1100. The treating vessel 1200 has an inner space 1280. The inner space 1280 is open at the top.

The substrate support unit 1400 supports the substrate W in the inner space 1280 of the treating vessel 1200. The substrate support unit 1400 has a support plate 1420, a rotary shaft 1440, and an actuator 1460. The support plate 1420 has a circular upper surface. The support plate 1420 has a smaller diameter than the substrate W. The support plate 1420 supports the substrate W by vacuum pressure. Selectively, the support plate 1420 may have a mechanical clamping structure that supports the substrate W. The rotary shaft 1440 is coupled to the center of the bottom surface of the support plate 1420, and the actuator 1460 providing torque to the rotary shaft 1440 is coupled to the rotary shaft 1440. The actuator 1460 may be a motor.

The liquid dispensing unit 1600 dispenses the treating liquid 82 onto the substrate W. The treating liquid 82 may be a coating solution such as photoresist. The liquid dispensing unit 1600 has a nozzle 1620, a nozzle moving member 1640, and a liquid supply source (not illustrated). The nozzle 1620 may include one or more nozzles. The nozzle 1620 dispenses the treating liquid 82 onto the substrate W. The nozzle 1620 is supported on the nozzle moving member 1640. The nozzle moving member 1640 moves the nozzle 1620 between a process position and a standby position. In the process position, the nozzle 1620 dispenses the treating liquid 82 onto the substrate W placed on the support plate 1420. After completely dispensing the treating liquid 82, the nozzle 1620 stands by in the standby position. In the standby position, the nozzle 1620 stands by in a home port (not illustrated). The home port is located outward of the treating vessel 1200 in the housing 1100.

A fan filter unit 1260 is disposed inside an upper wall of the housing 1100 and supplies a downward air flow 84 into the inner space 1120. The fan filter unit 1260 has a fan that introduces outside air into the inner space 1120 and a filter that filters the outside air.

An exhaust tube 1140 is connected to the housing 1100 so as to be located outward of the treating vessel 1200 and releases, to the outside, the air flow 84 supplied into the space between the treating vessel 1200 and the housing 1100.

The treating vessel 1200 has an outer cup 1220 and an inner cup 1240.

The outer cup 1220 surrounds the substrate support unit 1400 and the substrate W supported on the substrate support unit 1400. The outer cup 1220 has a bottom wall 1222, a sidewall 1224, and an upper wall 1226. The inside of the outer cup 1220 is provided as the inner space 1280 described above. The inner space 1280 includes a treating space and an exhaust space 1248 in a lower position than the treating space.

The bottom wall 1222 has a circular shape and has an opening in the center thereof. The sidewall 1224 extends upward from the outside end of the bottom wall 1222. The sidewall 1224 has a ring shape and is perpendicular to the bottom wall 1222. According to an embodiment, the sidewall 1224 extends to a height equal to or slightly lower than the height of the upper surface of the support plate 1420. The upper wall 1226 has a ring shape and has an opening in the center thereof. The upper wall 1226 obliquely extends upward from the upper end of the sidewall 1224 toward the central axis of the outer cup 1220.

The inner cup 1240 is located inside the outer cup 1220. The inner cup 1240 has an inner wall 1242, an outer wall 1244, and an upper wall 1246. The inner wall 1242 has a through-hole formed through the inner wall 1242 in the up/down direction. The inner wall 1242 is disposed to surround the actuator 1460. The inner wall 1242 minimizes exposure of the actuator 1460 to the air flow 84 in the treating space. The rotary shaft 1440 and/or the actuator 1460 of the substrate support unit 1400 extend in the up/down direction through the through-hole. The lower end of the inner wall 1242 may be located on the bottom wall 1222 of the outer cup 1220. The outer wall 1244 is spaced apart from the inner wall 1242 and surrounds the inner wall 1242. The outer wall 1244 is located to be spaced apart from the sidewall 1224 of the outer cup 1220. The inner wall 1242 is disposed to be spaced apart upward from the bottom wall 1222 of the outer cup 1220. The upper wall 1246 connects the upper end of the outer wall 1244 and the upper end of the inner wall 1242. The upper wall 1246 has a ring shape and is disposed to surround the support plate 1420. According to an embodiment, the upper wall 1246 has an upwardly convex shape. The upper wall 1246 has an outer upper wall 1246*a* obliquely extending upward from the upper end of the outer wall 1244 toward the rotary shaft 1440 and an inner upper wall 1246*b* obliquely extending downward from the outer upper wall 1246*a* to the upper end of the inner wall 1242. The support plate 1420 may be located in the space surrounded by the inner upper wall 1246*b*. According to an embodiment, the highest point of the upper wall 1226 may be located outward of the support plate 1420 and may be located inward of the edge of the substrate W supported on the substrate support unit 1400.

A portion of the treating space under the support plate 1420 may be provided as the exhaust space 1248. According to an embodiment, the exhaust space 1248 may be defined by the inner cup 1240. The space surrounded by the outer wall 1244, the upper wall 1246, and the inner wall 1242 of the inner cup 1240 and/or the space thereunder may be provided as the exhaust space 1248.

A gas-liquid separator 1230 may be provided in the inner space 1280 of the treating vessel 1200. The gas-liquid separator 1230 may extend upward from the bottom wall 1222 of the outer cup 1220. The gas-liquid separator 1230 may have a ring shape. The gas-liquid separator 1230, when viewed from above, may be located between the sidewall 1244 of the outer cup 1220 and the outer wall 1244 of the inner cup 1240. Selectively, the gas-liquid separator 1230, when viewed from above, may be located to overlap the outer wall 1244 of the inner cup 1240, or may be located inward of the outer wall 1244 of the inner cup 1240. According to an embodiment, the upper end of the gas-liquid separator 1230 may be located in a lower position than the lower end of the outer wall 1244 of the inner cup 1240.

A drain tube 1250 for draining the treating liquid 82 is connected to the bottom wall 1222 of the outer cup 1220. The drain tube 1250 drains, outside the treating vessel 1200, the treating liquid 82 introduced between the sidewall 1224 of the outer cup 1220 and the outer wall 1244 of the inner cup 1240. According to an embodiment, a space between the sidewall 1224 of the outer cup 1220 and the gas-liquid separator 1230 is provided as a drain space 1252 for draining the treating liquid 82, and the drain tube 1250 drains the treating liquid 82 from the drain space 1252. The air flow 84 flowing into the space between the sidewall 1224 of the outer cup 1220 and the outer wall 1244 of the inner cup 1240 is introduced into the space surrounded by the sidewall 1224 and the bottom wall 1222 of the outer cup 1220 and the gas-liquid separator 1230 and is introduced into the exhaust space 1248. In this process, the treating liquid 82 contained in the air flow 84 is drained outside the treating vessel 1200 from the drain space 1252 through the drain tube 1250, and the air flow 84 is introduced into the exhaust space 1248 of the treating vessel 1200.

One or more drain tubes 1250 may be provided. When a plurality of drain tubes 1250 are provided, the drain tubes 1250 may be arranged along the circumferential direction of the inner cup 1240.

Although not illustrated, a lifting actuator for adjusting the height of the outer cup 1220 relative to the support plate 1420 may be provided. According to an embodiment, the lifting actuator may move the outer cup 1220 upward and downward. For example, the support plate 1420 is located in a higher position than the upper end of the outer cup 1220 to prevent interference between a transfer member for transferring the substrate W and the outer cup 1220 when the substrate W is loaded onto or unloaded from the support plate 1420. Furthermore, when a process is performed, the support plate 1420 is located in a lower position than the upper end of the outer cup 1110 such that the substrate W is located in the treating space.

The exhaust unit 1900 has an exhaust tube 1800 and an air-flow guide duct 1700.

The exhaust tube 1800 releases, outside the treating vessel 1200, the air flow 84 introduced into the exhaust space 1248 of the treating vessel 1200. According to an embodiment, the exhaust tube 1800 is connected with the outer wall 1244 of the inner cup 1240. The exhaust tube 1800 may extend to the space between the outer wall 1244 and the inner wall 1242 of the inner cup 1240. Selectively, the exhaust tube 1800 may be coupled to the outer wall 1244 of the inner cup 1240 such that an inlet of the exhaust tube 1800 is provided on the outer wall 1244. According to an embodiment, the exhaust tube 1800 may be coupled to the treating vessel 1200 in a tangential direction with respect to the rotating direction of the substrate W. Selectively, the exhaust tube 1800 may be coupled to the treating vessel 1200 in a direction different from the tangential direction with respect to the rotating direction of the substrate W. Selectively, the exhaust tube 1800 may be coupled to the bottom wall 1222 of the outer cup 1220. A pressure adjustment member (not illustrated) is located in-line with the exhaust tube 1800 to forcibly suction the air flow 84 in the exhaust space 1248. For example, the pressure adjustment member may be a pump.

The air-flow guide duct 1700 guides the air flow 84 at a height equal to the height of an upper surface of the substrate W or at a height adjacent to the upper surface of the substrate W. When the substrate W rotates, the downward air flow 84 supplied to an upper region of the substrate W flows from a central region of the substrate W toward an edge region of the substrate W by the centrifugal force. On the surface of the substrate W and in a region adjacent thereto, the air flow 84 flows toward the outside of the substrate W while curving in the same direction as the rotating direction of the substrate W. When the air flow 84 deviates from the upper surface of the substrate W, the direction of the air flow 84 is tangential to the rotating direction of the substrate W.

The air-flow guide duct 1700 is provided such that the air flow 84 deviating from the upper surface of the substrate W is introduced into the air-flow guide duct 1700 in a tangential direction with respect to the rotating direction of the substrate W.

According to an embodiment, the air-flow guide duct 1700 is provided in the space between the outer cup 1220 and the inner cup 1240. The air-flow guide duct 1700 has a helical shape. According to an embodiment, the air-flow guide duct 1700 has the shape of a helix. The air-flow guide duct 1700 has an inlet and an outlet. The inlet is provided at the same position as the substrate W supported on the substrate support unit 1400, or at a position adjacent to the substrate W supported on the substrate support unit 1400. The outlet is provided in the drain space 1252 or at a position adjacent to the drain space 1252.

A guide plate 1720 having a helical shape is provided between the outer cup 1220 and the inner cup 1240, and the space surrounded by the outer cup 1220, the inner cup 1240, and the helical guide plate 1720 is defined as the air-flow guide duct 1700. The guide plate 1720 gradually lowered in height from the inlet to the outlet around and along the rotary shaft 1440 of the substrate support unit 1400 while maintaining the same distance from the rotary shaft 1440 of the substrate support unit 1400. The guide plate 1720 turns a predetermined number of times along the rotary shaft 1440 of the substrate support unit 1400. According to an embodiment, the predetermined number of times may be one to three times.

According to an embodiment, the inside end of the guide plate 1720 is located adjacent to the inner cup 1240, and the outside end of the guide plate 1720 is located adjacent to the outer cup 1220. Selectively, the inside end of the guide plate 1720 may be brought into contact with the inner cup 1240, or the outside end of the guide plate 1720 may be brought into contact with the outer cup 1220.

According to an embodiment, the guide plate 1720 is downwardly inclined farther away from the rotary shaft 1440 such that the inside end is located in a higher position than the outside end. A liquid-drain hole 1722 is formed in the region of the guide plate 1720 that is adjacent to the sidewall 1224 of the outer cup 1220. A plurality of liquid-drain holes 1722 may be formed along the lengthwise direction of the guide plate 1720. Accordingly, the treating liquid 82 dispensed onto the rotating substrate W from the nozzle 1620 and introduced into the air-flow guide duct 1700 together with the air flow 84 may flow into the drain space 1252 through the liquid-drain holes 1722. When the liquid-drain holes 1722 are not formed in the guide plate 1720, the treating liquid 82 may flow into the drain space 1252 while turning in a helical shape along the guide plate 1720.

Although it has been described that the air-flow guide duct 1700 is formed by the guide plate 1720 between the outer cup 1220 and the inner cup 1240, the air-flow guide duct 1700 may be provided as a structure independent of the outer cup 1220 and the inner cup 1240. For example, the air-flow guide duct 1700 may be provided as a tubular member located between the outer cup 1220 and the inner cup 1240.

Although it has been described that the exhaust tube 1800 is provided in the exhaust space 1248, the exhaust tube 1800 may be provided such that the inlet thereof is located at a position facing the outlet of the air-flow guide duct 1700 in the drain space 1252.

Figure 12:
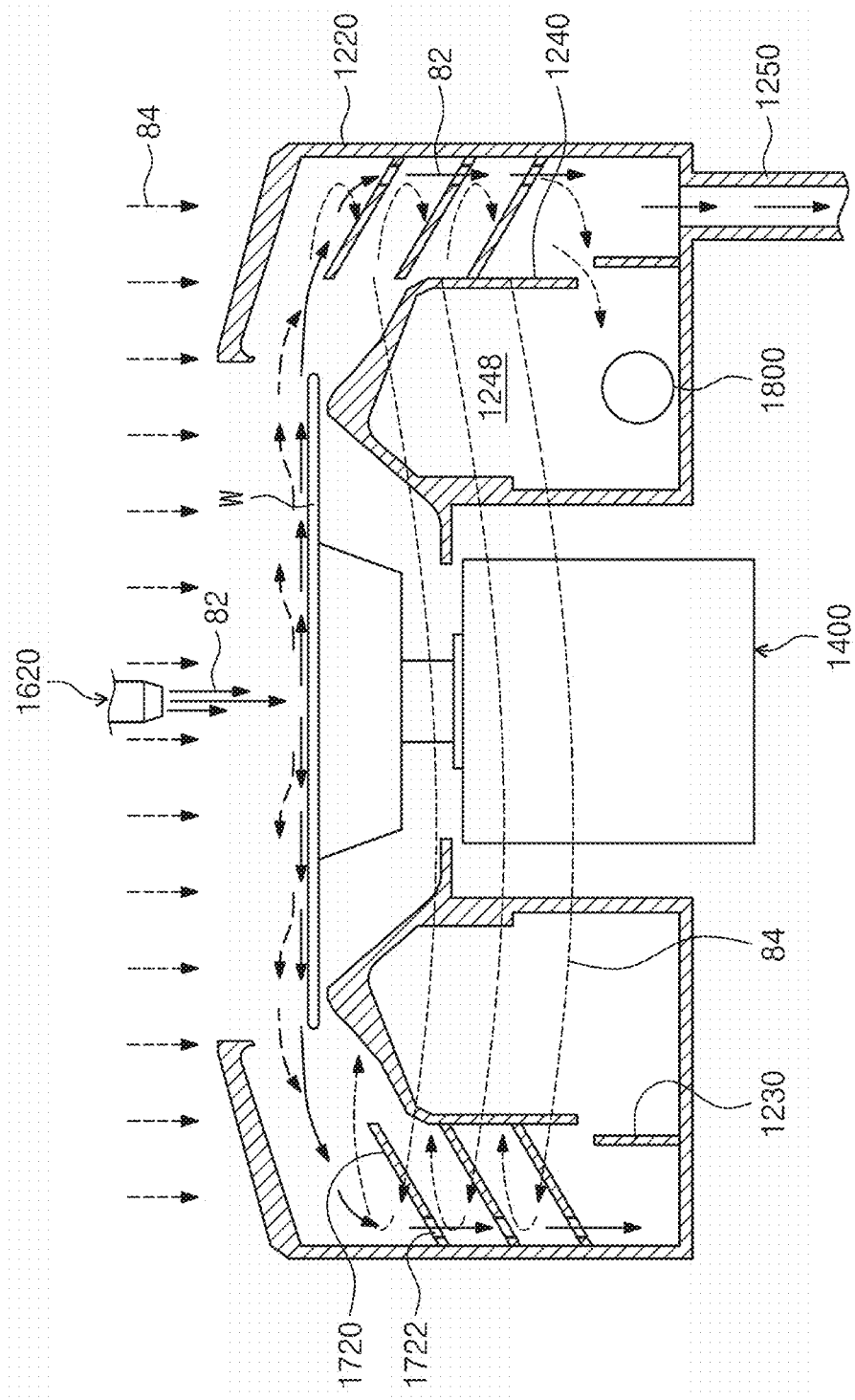
FIGS. 12 and 13 are a sectional view and a sectional perspective view illustrating flow paths of an air flow and a treating liquid in an inner space of a treating vessel when a substrate is subjected to liquid treatment through the apparatus of FIG. 10.
Figure 13:
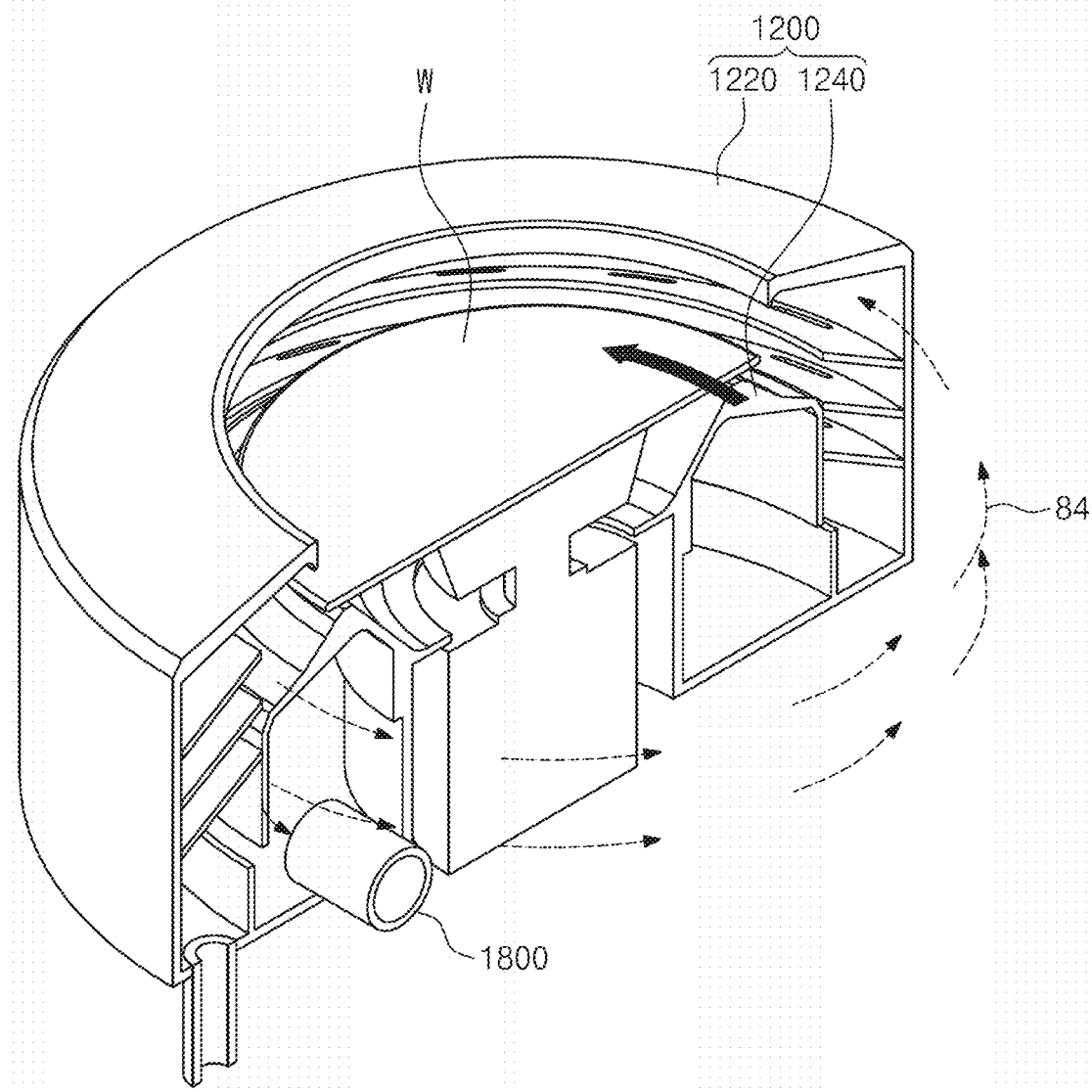

FIGS. 12 and 13 are a sectional view and a sectional perspective view illustrating flow paths of the air flow 84 and the treating liquid 82 in the inner space of the treating vessel 1200 when the substrate W is subjected to liquid treatment through the apparatus of FIG. 10.

Referring to FIGS. 12 and 13, in a coating process, the substrate W is supported on the support plate 1420 and is rotated by the support plate 1420. The substrate support unit 1400 rotates the substrate W such that the air flow 84 generated by the rotation of the substrate W flows toward the inlet of the air-flow guide duct 1700. Outside air is supplied as the downward air flow 84 from the fan filter unit 1260 toward the substrate W. Furthermore, the treating liquid 82, such as photoresist, is dispensed onto the substrate W from the nozzle 1620. On the upper surface of the substrate W and in a region adjacent thereto, due to the rotation of the substrate W, the air flow 84 flows toward the outside of the substrate W while curving in the rotating direction of the substrate W. When the air flow 84 flows toward the outside of the substrate W, the air flow 84 and the treating liquid 82 dispensed onto the substrate W are introduced into the air-flow guide duct 1700. At this time, the air flow 84 flowing toward the outside of the substrate W may be smoothly introduced into the air-flow guide duct 1700 without collision or interference with an external member because the air-flow guide duct 1700 is provided such that the air flow 84 is introduced into the air-flow guide duct 1700 in the tangential direction with respect to the rotating direction of the substrate W.

The air flow 84 introduced into the air-flow guide duct 1700 gradually flows downward in the inner space while continually turning in a helical shape. At this time, the treating liquid 82 introduced into the air-flow guide duct 1700 flows toward the liquid-drain holes 1722 formed in the guide plate 1720 due to the slope of the guide plate 1720 and falls into the drain space 1252 through the liquid-drain holes 1722. Thereafter, the treating liquid 82 is drained outside the treating vessel 1200 through the drain tube 1250. The air flow 84 flowing into the drain space 1252 from the air-flow guide duct 1700 through the outlet is introduced into the exhaust space 1248 and thereafter released outside the treating vessel 1200 through the exhaust tube 1800.

Hereinafter, a substrate treating apparatus 2000 according to a second embodiment of the inventive concept will be described in more detail with reference to FIGS. 14 to 16.

Figure 14:
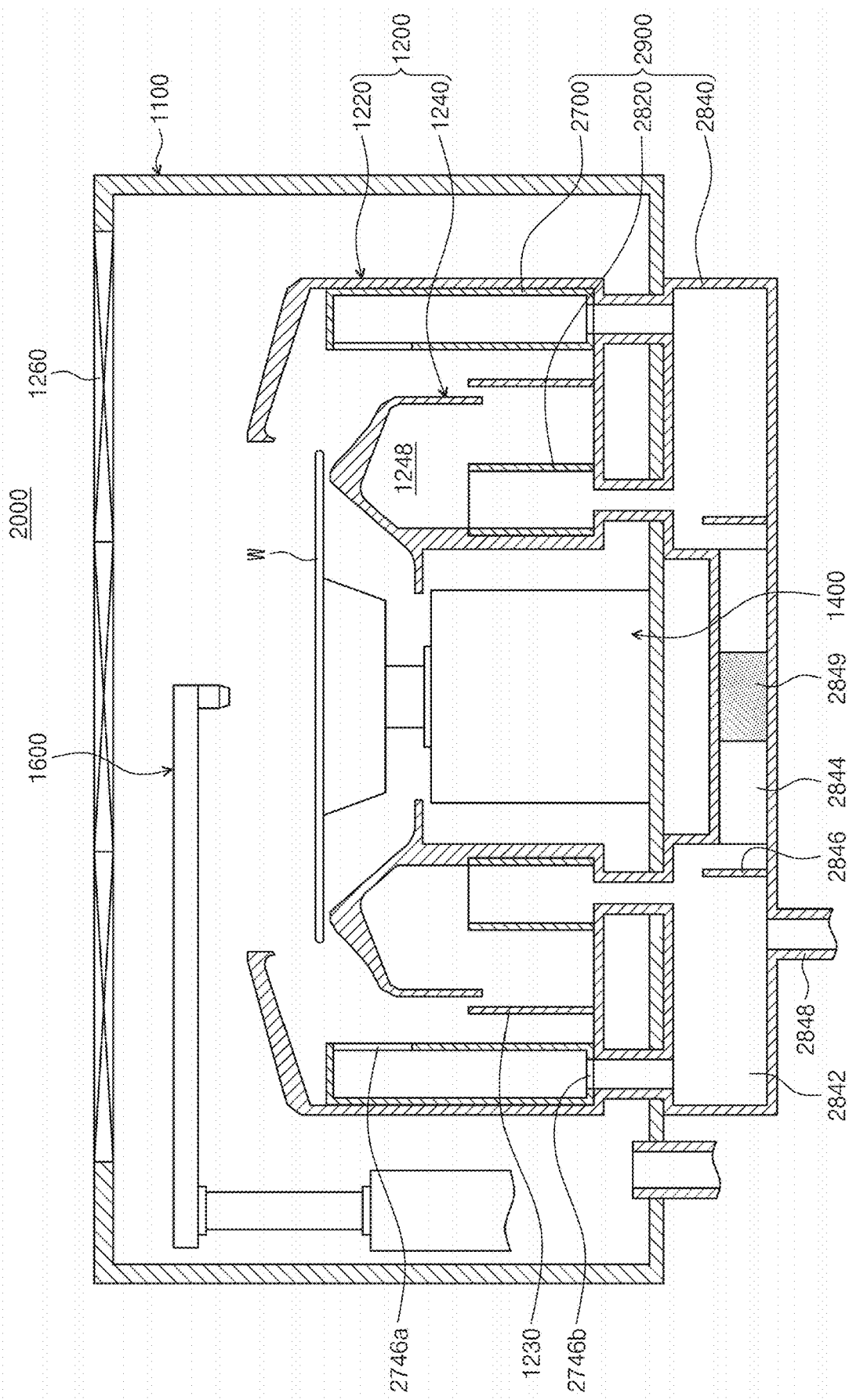
FIG. 14 is a schematic sectional view illustrating a structure of a substrate treating apparatus for treating a substrate by dispensing a liquid onto the rotating substrate according to a second embodiment of the inventive concept.
Figure 15:
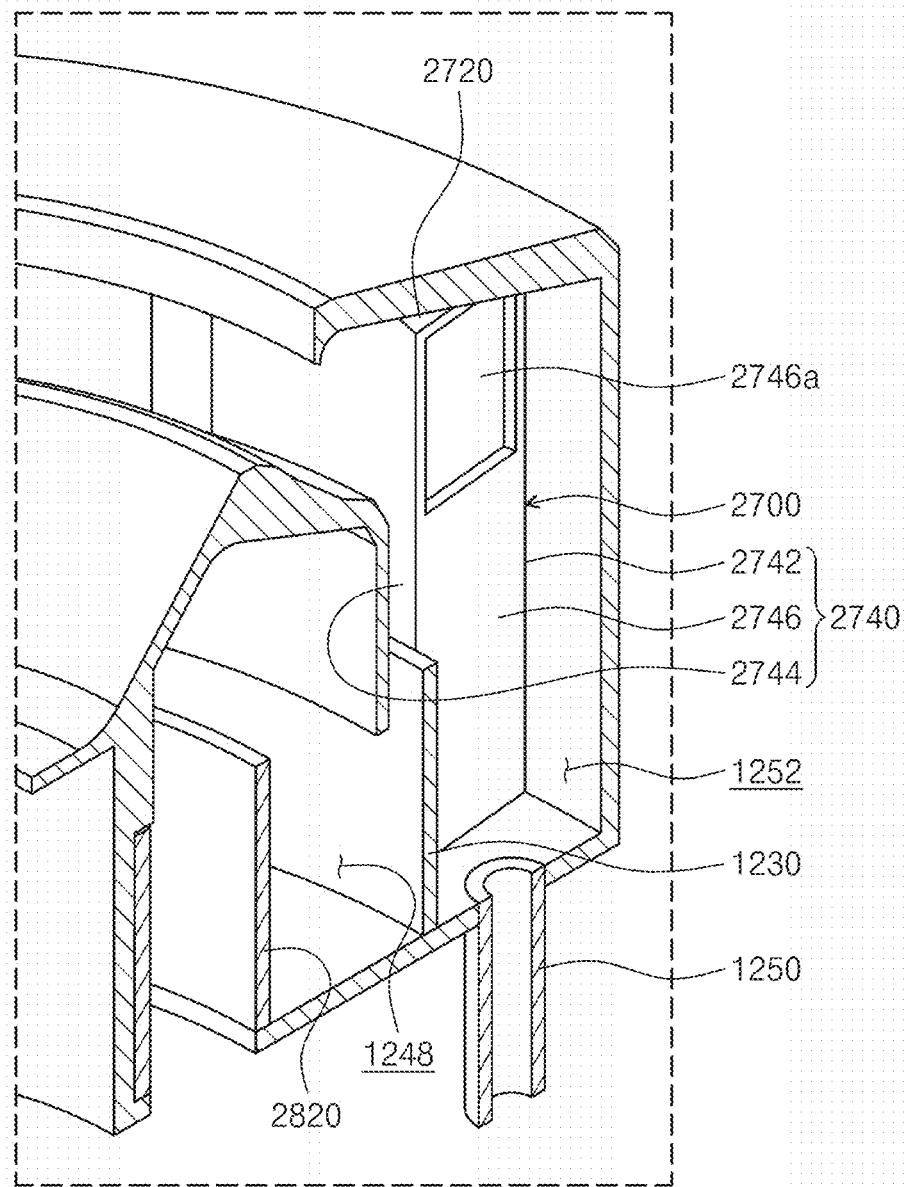
FIG. 15 is a sectional perspective view of the apparatus of FIG. 14.
Figure 16:
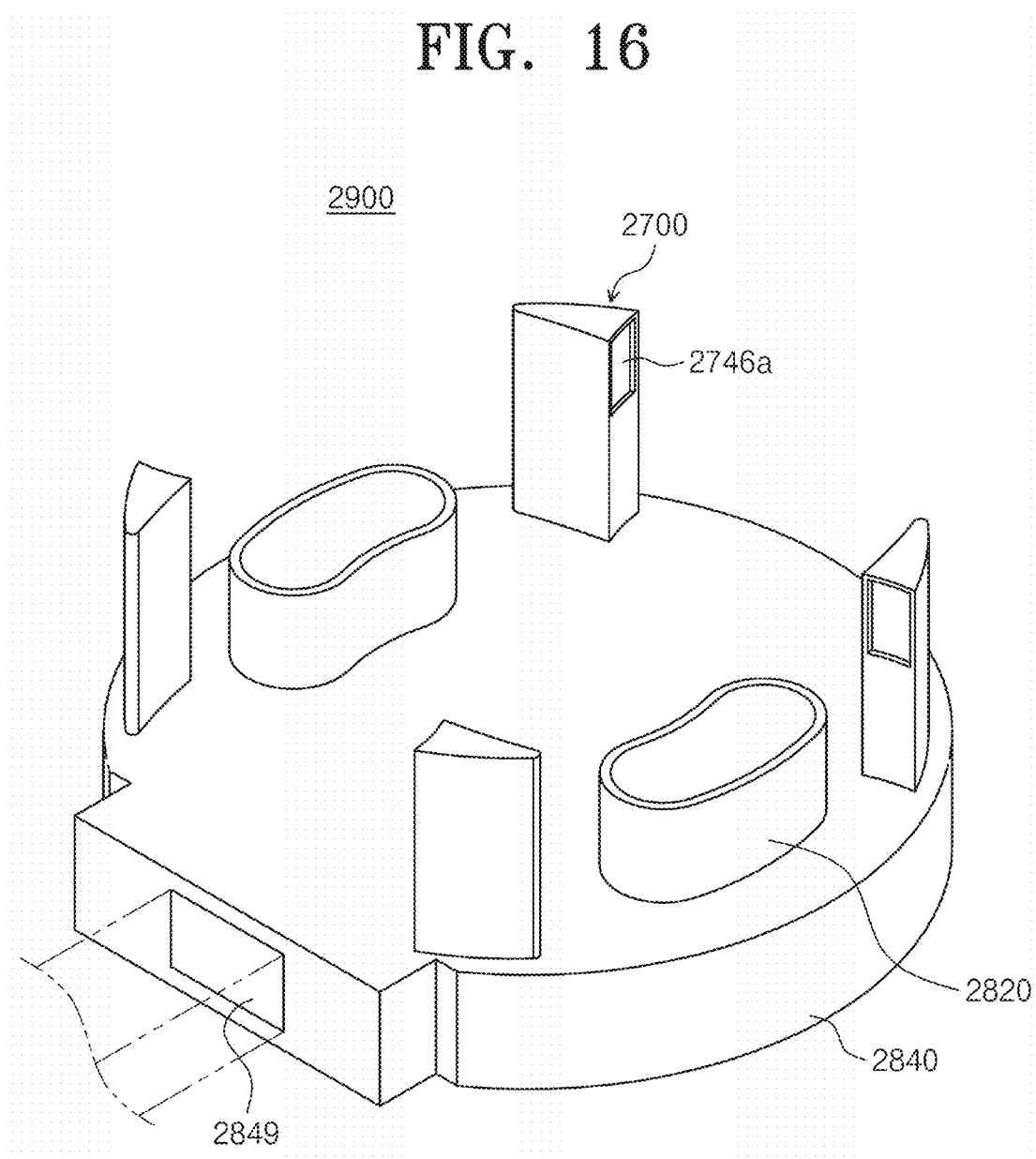
FIG. 16 is a schematic perspective view illustrating a structure of an exhaust unit in the apparatus of FIG. 14.

FIGS. 14 to 16 are views illustrating the substrate treating apparatus 2000 including an air-flow guide duct 2700 according to the second embodiment of the inventive concept. FIG. 14 is a sectional view of the substrate treating apparatus 2000 according to the second embodiment, FIG. 15 is a sectional perspective view of the apparatus of FIG. 14, and FIG. 16 is a schematic perspective view illustrating a structure of an exhaust unit 2900 in the apparatus of FIG. 14.

Referring to FIGS. 14 to 16, the exhaust unit 2900 releases an air flow 84 in a treating space. The exhaust unit 2900 has a separate exhaust tube 2820 and the air-flow guide duct 2700.

The separate exhaust tube 2820 is connected with an exhaust space 1248 in the substrate treating apparatus 2000. One or more separate exhaust tubes 2820 may be provided. According to an embodiment, the separate exhaust tube 2820 is connected to a bottom wall 1222 of an outer cup 1220, and an inlet of the separate exhaust tube 2820 is located to be spaced apart upward from the bottom wall 1222 of the outer cup 1220 by a predetermined height.

The air-flow guide duct 2700 guides the air flow 84 at a height equal to the height of an upper surface of a substrate W supported on a substrate support unit 1400 or at a height adjacent to the upper surface of the substrate W. When the substrate W rotates, the downward air flow 84 supplied to an upper region of the substrate W flows from a central region of the substrate W toward an edge region of the substrate W by the centrifugal force. Furthermore, on the surface of the substrate W and in a region adjacent thereto, the air flow 84 flows toward the outside of the substrate W while curving in the same direction as the rotating direction of the substrate W. When the air flow 84 deviates from the upper surface of the substrate W, the direction of the air flow 84 is tangential to the rotating direction of the substrate W.

The air-flow guide duct 2700 is provided such that the air flow 84 deviating from the upper surface of the substrate W is introduced into the air-flow guide duct 2700 in a tangential direction with respect to the rotating direction of the substrate W.

The air-flow guide duct 2700 may be disposed between the outer cup 1220 and an inner cup 1240. The air-flow guide duct 2700 may be disposed closer to the outer cup 1220 than to the inner cup 1240. According to an embodiment, the air-flow guide duct 2700 may be provided on an inner wall 1224 of the outer cup 1220. A passage through which the air flow 84 flows is provided between the air-flow guide duct 2700 and an outer wall 1244 of the inner cup 1240, and part of the air flow 84 may flow through the passage. The air-flow guide duct 2700 has an inlet 2746a and an outlet 2746b. The inlet 2746a is provided at the same position as the substrate W supported on the substrate support unit 1400, or at a position adjacent to the substrate W supported on the substrate support unit 1400. The outlet 2746b may be connected with an integrated exhaust tube 2840 to be described below.

According to an embodiment, the air-flow guide duct 2700 has a tubular shape. The lengthwise direction of the air-flow guide duct 2700 may be perpendicular to the bottom wall 1222 of the outer cup 1220. The air-flow guide duct 2700 has an upper wall 2720 and a sidewall 2740. The sidewall 2740 has a first side surface 2742 facing the inside surface of the outer cup 1220, a second side surface 2744 facing toward the substrate W placed on the substrate support unit 1400, and a third side surface 2746 facing a tangential direction with respect to the rotating direction of the substrate W. The upper wall 2720 of the air-flow guide duct 2700 serves as a blocking face. The first side surface 2742 and the second side surface 2744 of the sidewall 2740 of the air-flow guide duct 2700 serve as blocking faces. The inlet 2746a of the air-flow guide duct 2700 is formed in the third side surface 2746, and the portion of the third side surface 2746 other than the inlet 2746a serves as a blocking face. The air-flow guide duct 2700 may have a constant cross-section along the lengthwise direction thereof. Furthermore, the distance between the second side surface 2744 of the sidewall 2740 of the air-flow guide duct 2700 and a rotary shaft 1440 of the substrate support unit 1400 may be increased farther away from the inlet 2746a. Accordingly, when viewed from above, the air-flow guide duct 2700 may have a gradually deceasing area farther away from the inlet 2746a. The inlet 2746a may be formed in an upper region of the first side surface 2742. The inlet 2746a may have a rectangular shape.

One or more air-flow guide ducts 2700 may be provided. According to an embodiment, four air-flow guide ducts 2700 may be provided. The four air-flow guide ducts 2700 may be provided at equal intervals with respect to the center of rotation of the substrate W.

The integrated exhaust tube 2840 is disposed outside the outer cup 1220. According to an embodiment, the integrated exhaust tube 2840 may be disposed outside a housing 1100. The integrated exhaust tube 2840 has an air-flow introduction part 2842 and an air-flow discharge part 2844.

The air-flow introduction part 2842 has a ring shape. The separate exhaust tube 2820 and the air-flow guide duct 2700 are coupled with the air-flow introduction part 2842, and gas flowing out of the separate exhaust tube 2820 and the air-flow guide duct 2700 is introduced into the air-flow introduction part 2842 of the integrated exhaust tube 2840. The air-flow discharge part 2844 is located in a space surrounded by the air-flow introduction part 2842. The integrated exhaust tube 2840 has an external duct 2849 coupled with the air-flow discharge part 2844, and a pressure adjustment member (not illustrated), such as a pump, may be coupled to the external duct 2849.

The separate exhaust tube 2820 is coupled to the air-flow introduction part 2842 at a position closer to the air-flow discharge part 2844 than the air-flow guide duct 2700. A gas-liquid separator 2846 may be provided between the point where the separate exhaust tube 2820 is connected to the air-flow introduction part 2842 and the air-flow discharge part 2844. According to an embodiment, the gas-liquid separator 2846 may be provided in the air-flow introduction part 2842. The gas-liquid separator 2846 has a ring shape and protrudes upward from the bottom surface of the air-flow introduction part 2842. Furthermore, the gas-liquid separator 2846 is spaced apart from the upper surface of the air-flow introduction part 2842.

A drain tube 2848 is provided on the opposite side to the air-flow discharge part 2844 with respect to the point where the gas-liquid separator 2846 is installed in the air-flow introduction part 2842. The drain tube 2848 drains, outside the integrated exhaust tube 2840, a liquid separated from the air flow 84 introduced into the air-flow introduction part 2842. According to an embodiment, the drain tube 2848 is provided at a position adjacent to the gas-liquid separator 2846.

Figure 17:
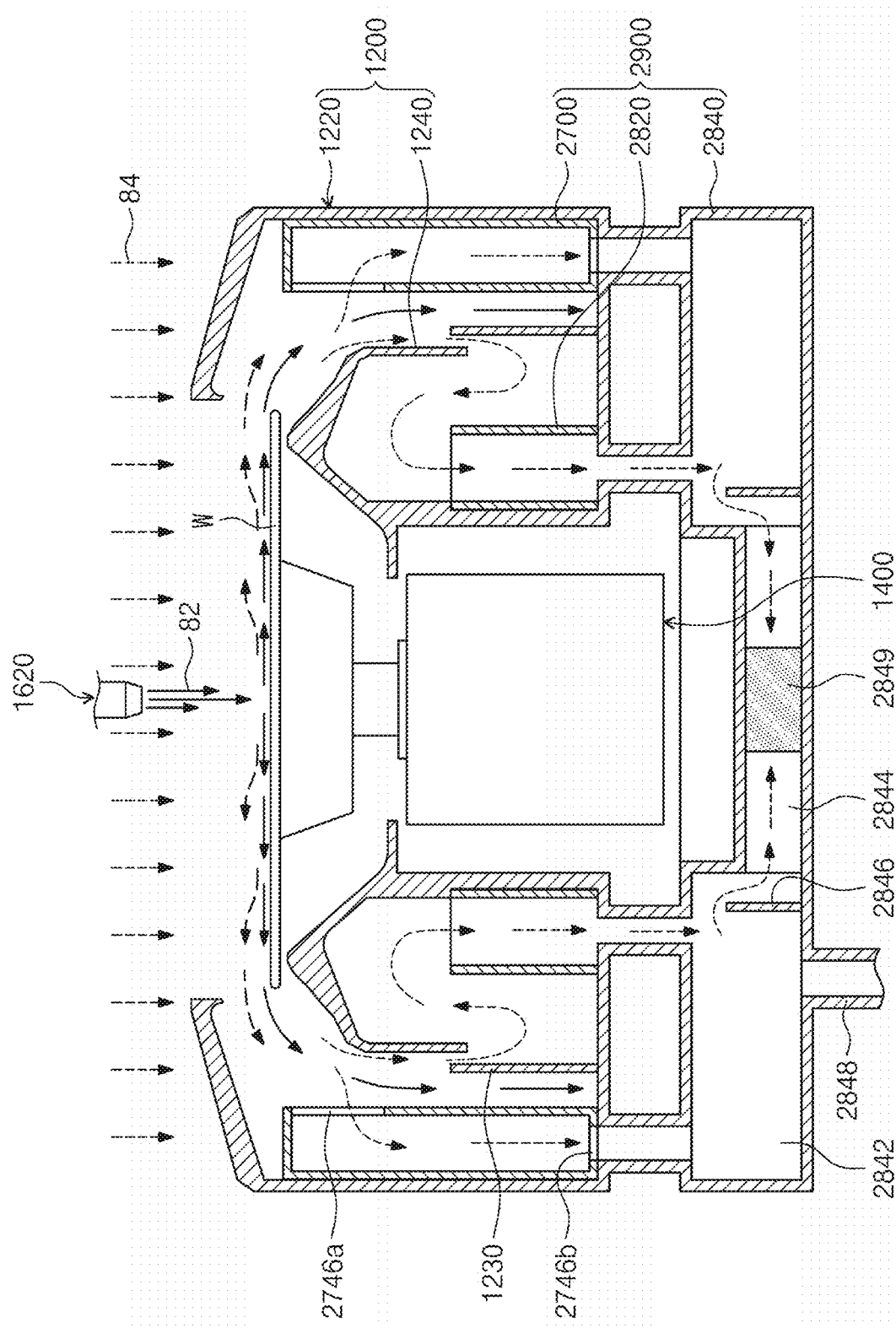
FIGS. 17 and 18 are a sectional view and a sectional perspective view illustrating flow paths of an air flow and a treating liquid when a substrate is subjected to liquid treatment through the apparatus of FIG. 14.
Figure 18:
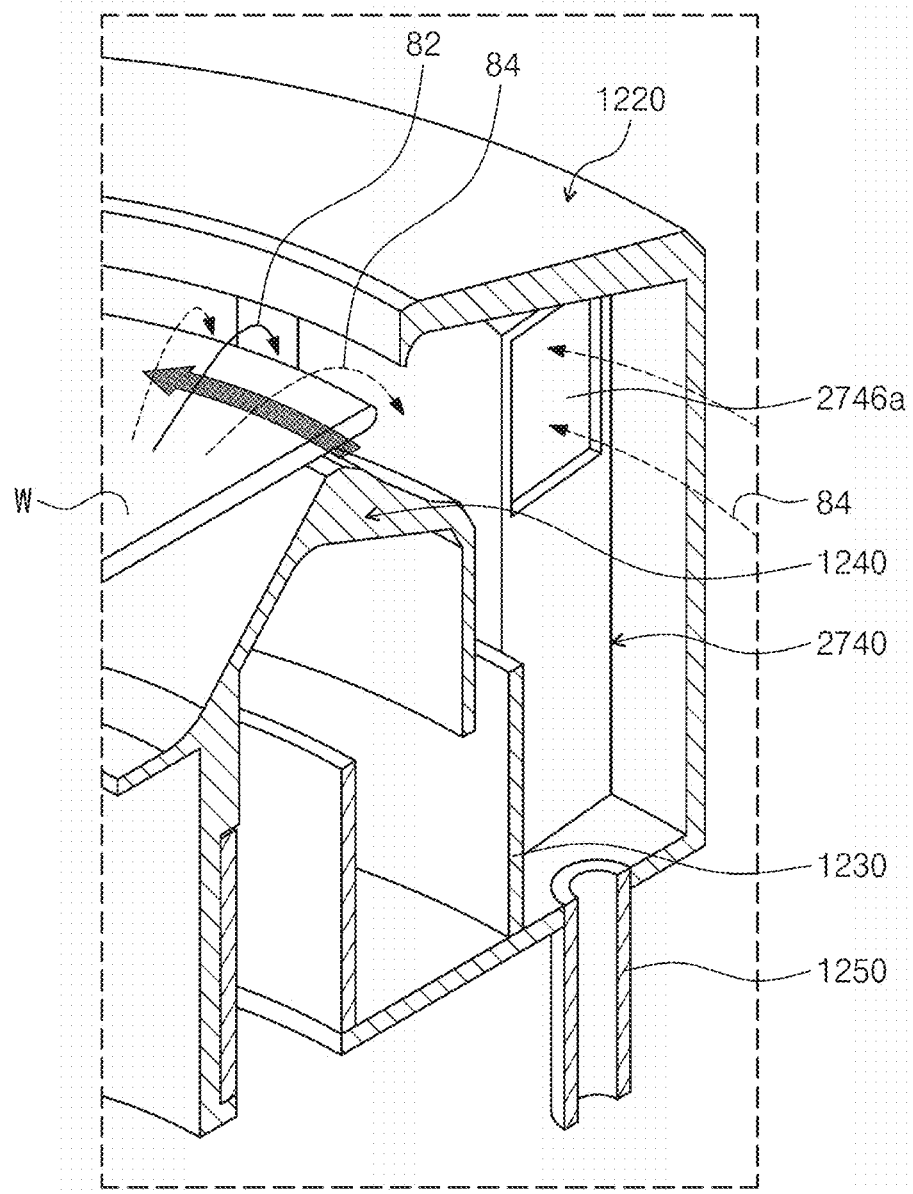

FIGS. 17 and 18 are a sectional view and a sectional perspective view illustrating flow paths of the air flow 84 and the treating liquid 82 when the substrate W is subjected to liquid treatment through the apparatus of FIG. 14.

Referring to FIGS. 17 and 18, in a coating process, the substrate W is supported on the support plate 1420 and is rotated by the support plate 1420. At this time, the substrate support unit 1400 rotates the substrate W such that the air flow 84 generated by the rotation of the substrate W flows toward the inlet 2746a of the air-flow guide duct 2700. Outside air is supplied as the downward air flow 84 from the fan filter unit 1260 toward the substrate W. Furthermore, the treating liquid 82 is dispensed onto the substrate W from the nozzle 1620. Due to the rotation of the substrate W, the air flow 84 on the upper surface of the substrate W flows toward the outside of the substrate W while curving in the rotating direction of the substrate W. When the air flow 84 flows toward the outside of the substrate W, part of the air flow 84 is introduced into the air-flow guide duct 2700 and thereafter released outside the treating vessel 1200. Furthermore, the rest of the air flow 84 flows downward through the gap between the inner cup 1240 and the outer cup 1220. Thereafter, the rest of the air flow 84 is introduced into the exhaust space 1248 in the treating vessel 1200 and released outside the treating vessel 1200 through the separate exhaust tube 2820. In addition, the treating liquid 82 used to treat the substrate W is introduced into the drain space 1252 through the space between the inner cup 1240 and the outer cup 1220 and thereafter drained outside the treating vessel 1200 through the drain tube 1250.

The air flow 84 released from the air-flow guide duct 2700 and the separate exhaust tube 2820 is introduced into the air-flow introduction part 2842 of the integrated exhaust tube 2840. Thereafter, the treating liquid 82 is separated by the gas-liquid separator 2846, and the air flow 84 is released to the outside through the air-flow discharge part 2844.

According to the embodiment of FIG. 14, part of the air flow 84 is introduced into the air-flow guide duct 2700. At this time, the air flow 84 flowing toward the outside of the substrate W by the centrifugal force may be smoothly introduced into the air-flow guide duct 2700 without collision or interference with an external member because the air-flow guide duct 2700 is provided such that the air flow 84 is introduced into the air-flow guide duct 2700 in the tangential direction with respect to the rotating direction of the substrate W.

Furthermore, part of the air flow 84 is introduced into the exhaust space 1248 in the treating vessel 1200. However, the amount of air flow 84 introduced into the exhaust space 1248 is very small, as compared with when the air-flow guide duct 2700 is not provided. Thus, the air flow 84 may be smoothly released through the exhaust space 1248 without a vortex or a big collision.

In the above-described embodiment, it has been described that the air flow 84 supplied to the substrate W flows into the exhaust space 1248, which is located under the support plate 1420, along the first path and flows into the air-flow guide duct 2700 along the second path. However, the substrate treating apparatus 2000 may be configured such that all of the air flow 84 supplied to the substrate W flows along only the second path.

Hereinafter, a substrate treating apparatus 3000 according to a third embodiment of the inventive concept will be described in more detail with reference to FIGS. 19 to 21.

Figure 19:
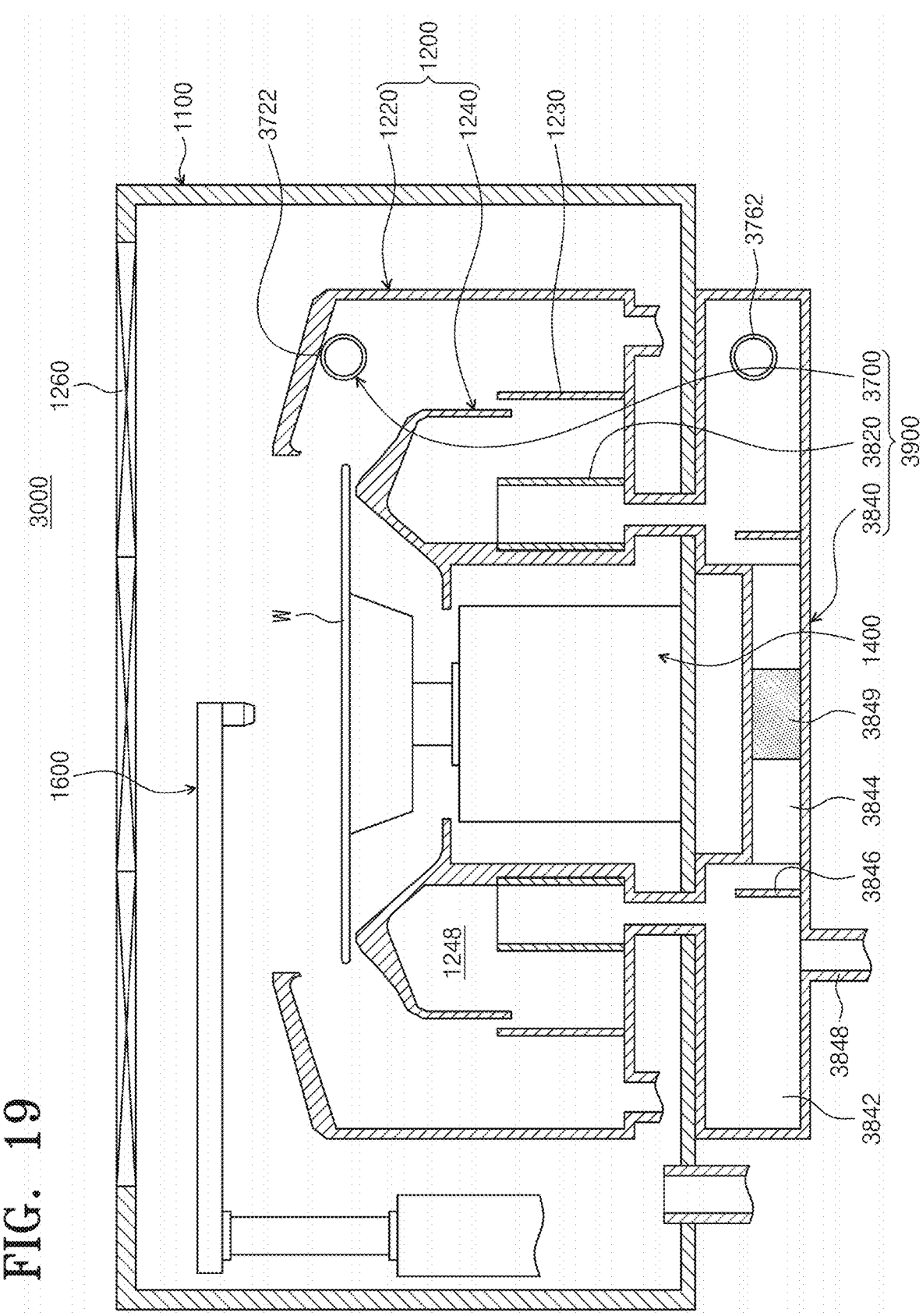
FIG. 19 is a schematic sectional view illustrating a structure of a substrate treating apparatus for treating a substrate by dispensing a liquid onto the rotating substrate according to a third embodiment of the inventive concept.
Figure 20:
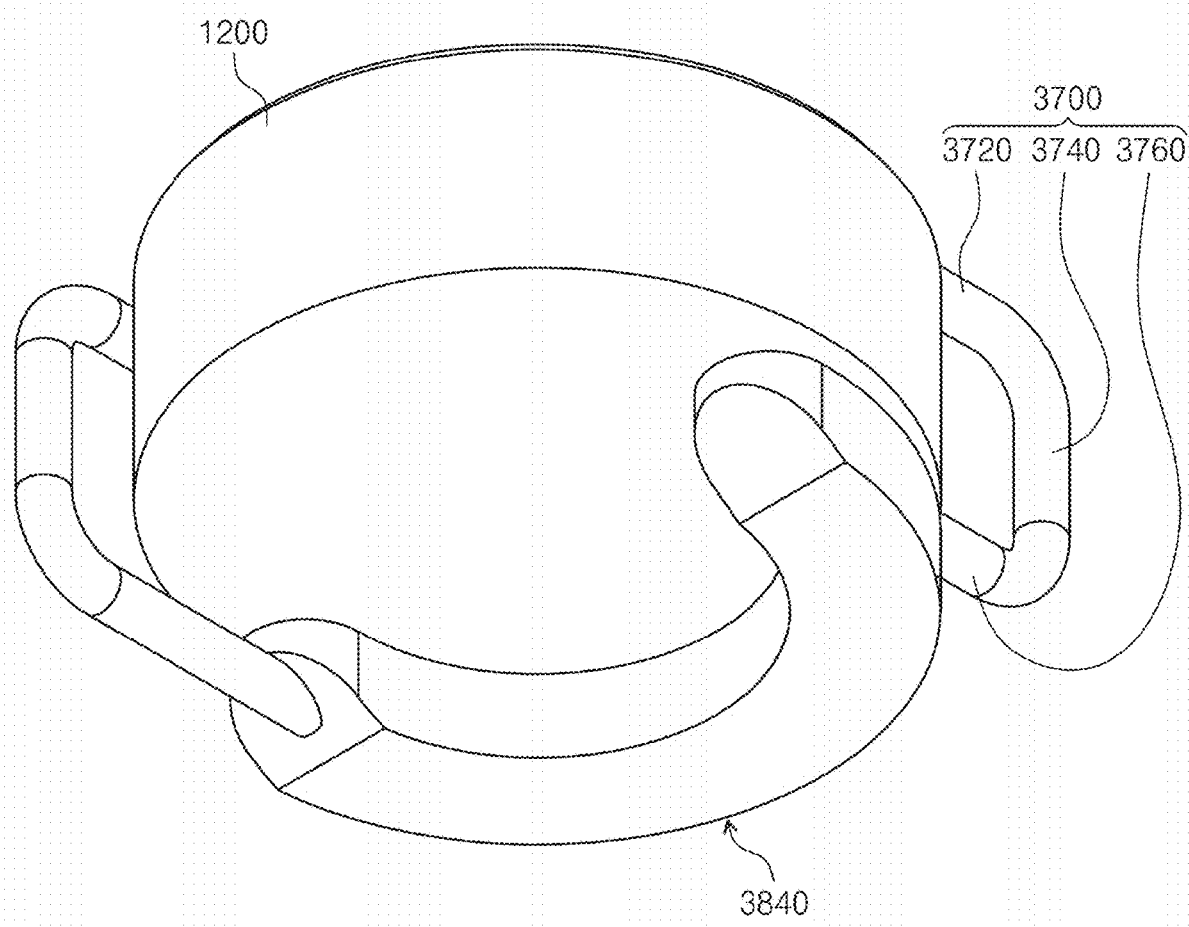
FIG. 20 is a perspective view illustrating the exterior of the substrate treating apparatus of FIG. 19.
Figure 21:
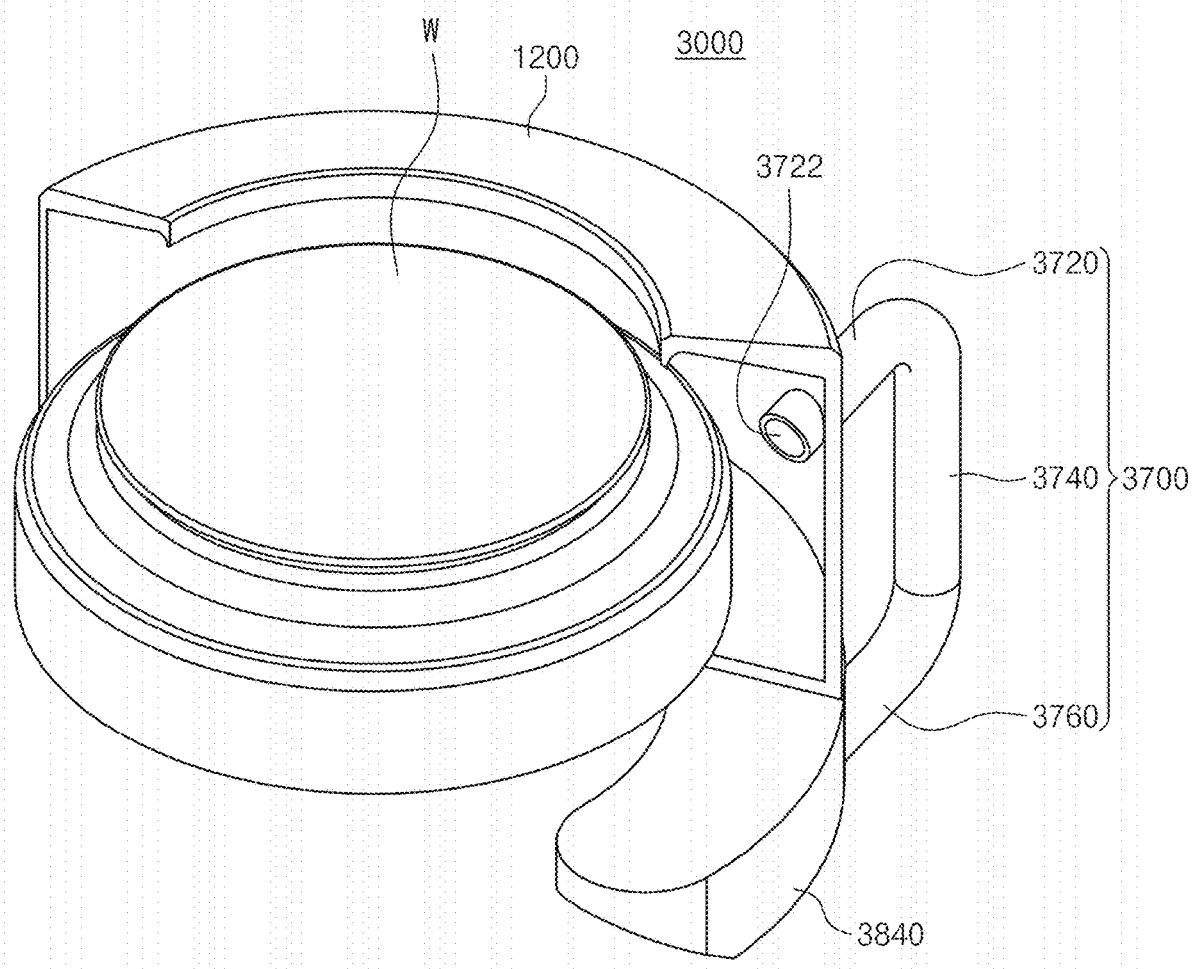
FIG. 21 is a sectional perspective view of the substrate treating apparatus of FIG. 19.

FIGS. 19 to 21 are views illustrating the substrate treating apparatus 3000 including an air-flow guide duct 3700 according to the third embodiment of the inventive concept.

FIG. 19 is a schematic sectional view illustrating the substrate treating apparatus 3000 including the air-flow guide duct 3700 according to the third embodiment of the inventive concept, FIG. 20 is a perspective view illustrating the exterior of the substrate treating apparatus 3000 of FIG. 19, and FIG. 21 is a sectional perspective view illustrating the substrate treating apparatus 3000 of FIG. 19.

Referring to FIGS. 19 to 21, an exhaust unit 3900 releases an air flow 84 in an inner space of a treating vessel 1200. The exhaust unit 3900 has a separate exhaust tube 3820, the air-flow guide duct 3700, and an integrated exhaust tube 3840.

The separate exhaust tube 3820 is connected with an exhaust space 1248 in the substrate treating apparatus 3000. One or more separate exhaust tubes 3820 may be provided. According to an embodiment, the separate exhaust tube 3820 is connected to a bottom wall 1222 of an outer cup 1220, and an inlet 3722 of the separate exhaust tube 3820 is located to be spaced apart from the bottom wall 1222 of the outer cup 1220 by a predetermined height.

The air-flow guide duct 3700 guides the air flow 84 at a height equal to the height of an upper surface of a substrate W supported on a substrate support unit 1400 or at a height adjacent to the upper surface of the substrate W. When the substrate W rotates, the downward air flow 84 supplied to an upper region of the substrate W flows from a central region of the substrate W toward an edge region of the substrate W by the centrifugal force. Furthermore, on the surface of the substrate W and in a region adjacent thereto, the air flow 84 flows toward the outside of the substrate W while curving in the same direction as the rotating direction of the substrate W. When the air flow 84 deviates from the upper surface of the substrate W, the direction of the air flow 84 is tangential to the rotating direction of the substrate W.

The air-flow guide duct 3700 is provided such that the air flow 84 deviating from the upper surface of the substrate W is introduced into the air-flow guide duct 3700 in a tangential direction with respect to the rotating direction of the substrate W.

The air-flow guide duct 3700 is disposed outside the treating vessel 1200. The air-flow guide duct 3700 has an air-flow introduction part 3720, a connecting part 3740, and an air-flow discharge part 3760. The air-flow introduction part 3720 has the inlet 3722 through which the air flow 84 flows into the air-flow introduction part 3720 from a treating space. The inlet 3722 is provided at the same height as the substrate W supported on the substrate support unit 1400 or at a height adjacent to the substrate W. The inlet 3722 is provided such that the air flow 84 is introduced in a direction parallel to a tangential direction of the substrate W supported on the substrate support unit 1400. The air-flow discharge part 3760 has an outlet 3762. The air-flow discharge part 3760 may be connected with the integrated exhaust tube 3840 to be described below. The connecting part 3740 connects the air-flow introduction part 3720 and the air-flow discharge part 3760.

The air-flow guide duct 3700 has a tubular shape. The air-flow introduction part 3720 of the air-flow guide duct 3700 is provided such that the lengthwise direction thereof is parallel to the tangential direction of the substrate W. Furthermore, the air-flow discharge part 3760 of the air-flow guide duct 3700 may be disposed under the air-flow introduction part 3720 and may be parallel to the air-flow introduction part 3720 to face the air-flow introduction part 3720. The connecting part 3740 may be provided such that the lengthwise direction thereof is perpendicular to the air-flow introduction part 3720 and the air-flow discharge part 3760.

One or more air-flow guide ducts 3700 may be provided. According to an embodiment, two air-flow guide ducts 3700 may be provided. The two air-flow guide ducts 3700 may be spaced apart from each other at a predetermined interval with respect to the center of rotation of the substrate W. Selectively, three or more air-flow guide ducts 3700 may be provided.

The integrated exhaust tube 3840 is disposed outside the outer cup 1220. According to an embodiment, the integrated exhaust tube 3840 may be disposed outside a housing 1100. The integrated exhaust tube 3840 has an air-flow introduction part 3842 and an air-flow discharge part 3844.

According to an embodiment, the air-flow introduction part 3842 has a ring shape. The air-flow introduction part 3842 is coupled with the separate exhaust tube 3820 and the air-flow guide duct 3700, and gas flowing out of the separate exhaust tube 3820 and the air-flow guide duct 3700 is introduced into the air-flow introduction part 3842 of the integrated exhaust tube 3840. The air-flow discharge part 3844 is located in a space surrounded by the air-flow introduction part 3842, and a connecting part connects the air-flow introduction part 3842 and the air-flow discharge part 3844 to allow the gas introduced into the air-flow introduction part 3842 to flow toward the air-flow discharge part 3844. The separate exhaust tube 3820 is connected to the air-flow introduction part 3842 at a position closer to the air-flow discharge part 3844 than the air-flow guide duct 3700. A gas-liquid separator 3846 may be provided between the point where the separate exhaust tube 3820 is connected to the air-flow introduction part 3842 and the air-flow discharge part 3844. According to an embodiment, the gas-liquid separator 3846 may be provided in the air-flow introduction part 3842. The gas-liquid separator 3846 has an arc shape and protrudes upward from the bottom surface of the air-flow introduction part 3842. Furthermore, the gas-liquid separator 3846 is spaced apart from the upper surface of the air-flow introduction part 3842. The space between the gas-liquid separator 3846 and the air-flow introduction part 3842 serves as a passage through which the air flow 84 introduced into the air-flow introduction part 3842 flows to the air-flow discharge part 3844.

A drain tube 3848 is provided on the opposite side to the air-flow discharge part 3844 with respect to the point where the gas-liquid separator 3846 is installed in the air-flow introduction part 3842. The drain tube 3848 drains, outside the integrated exhaust tube 3840, a liquid separated from the air flow 84 introduced into the air-flow introduction part 3842. According to an embodiment, the drain tube 3848 is provided at a position adjacent to the gas-liquid separator 3846.

Figure 22:
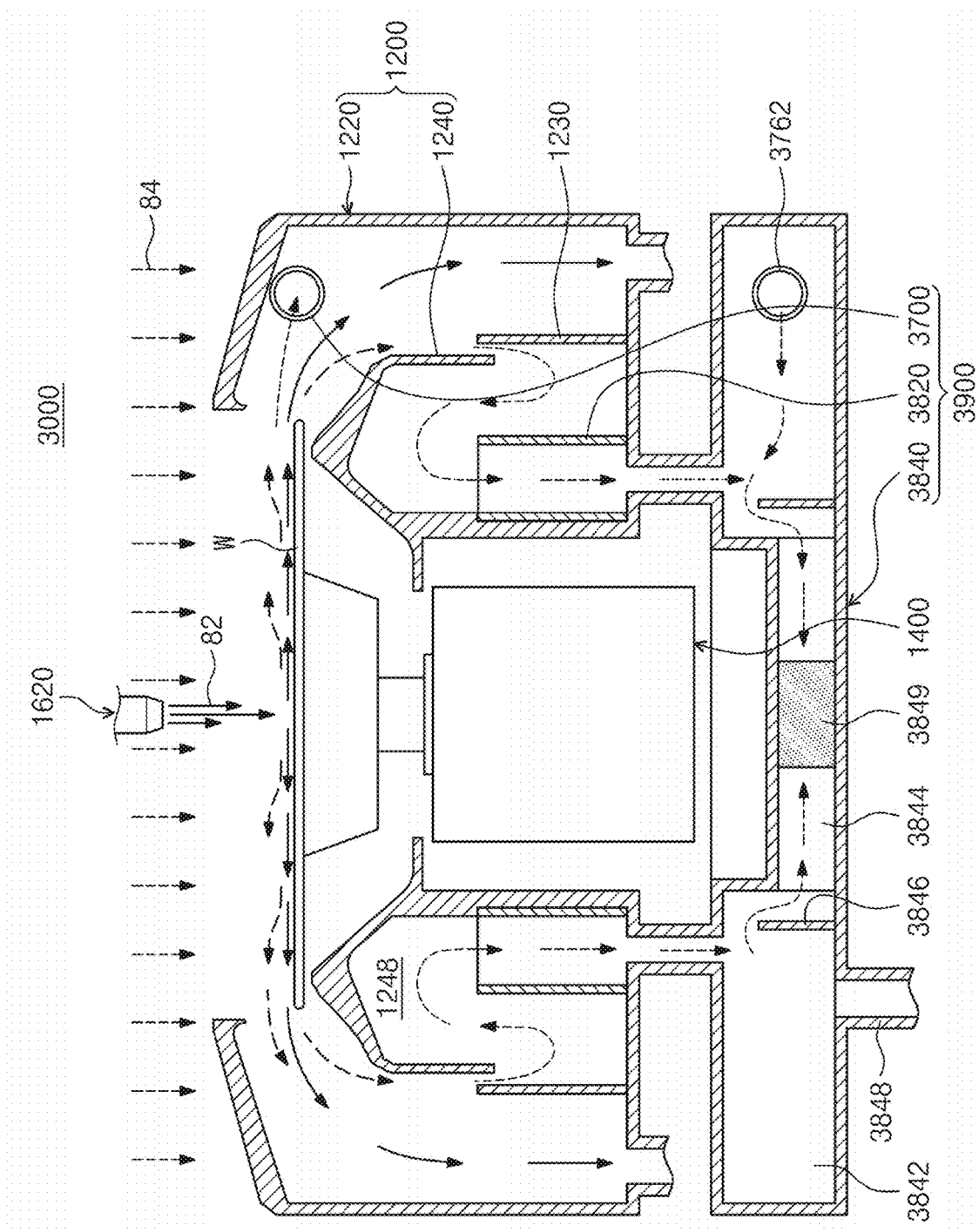
FIGS. 22 and 23 are a sectional view and a sectional perspective view illustrating flow paths of an air flow and a treating liquid when a substrate is subjected to liquid treatment through the apparatus of FIG. 19.
Figure 23:
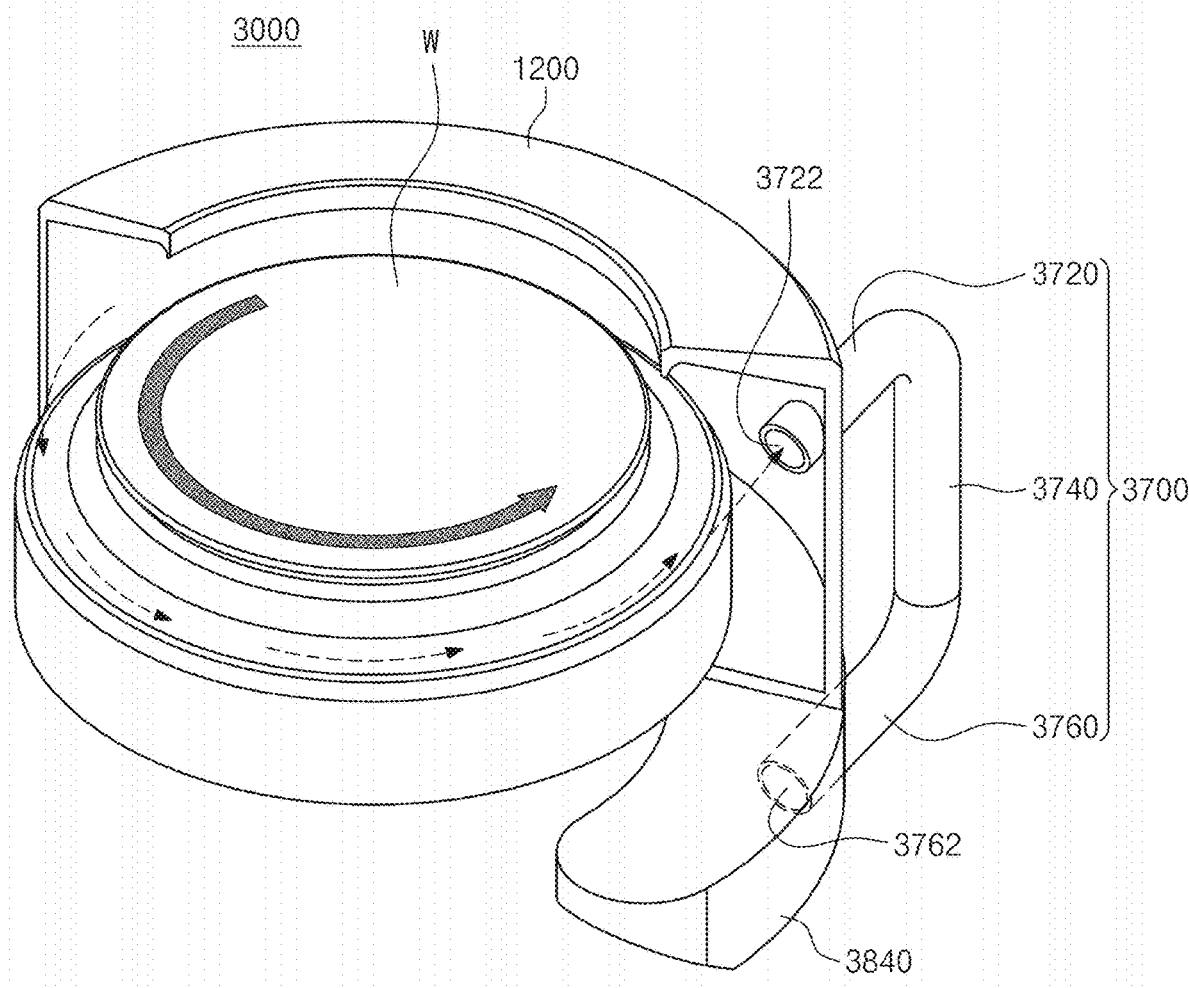

FIGS. 22 and 23 are a sectional view and a sectional perspective view illustrating flow paths of an air flow and a treating liquid when a substrate is subjected to liquid treatment through the apparatus of FIG. 19.

Referring to FIGS. 22 and 23, in a coating process, the substrate W is supported on the support plate 1420 and is rotated by the support plate 1420. At this time, the substrate support unit 1400 rotates the substrate W such that the air flow 84 generated by the rotation of the substrate W flows toward the inlet 3722 of the air-flow guide duct 3700. Outside air is supplied as the downward air flow 84 from the fan filter unit 1260 toward the substrate W. Furthermore, the treating liquid 82 is dispensed onto the substrate W from the nozzle 1620. Due to the rotation of the substrate W, the air flow 84 on the upper surface of the substrate W flows toward the outside of the substrate W while turning in the rotating direction of the substrate W. When the air flow 84 flows toward the outside of the substrate W, part of the air flow 84 is introduced into the air-flow guide duct 3700 and thereafter released outside the treating vessel 1200. Furthermore, the rest of the air flow 84 flows downward through the space between the inner cup 1240 and the outer cup 1220. Thereafter, the rest of the air flow 84 is introduced into the exhaust space 1248 in the treating vessel 1200 and released outside the treating vessel 1200 through the separate exhaust tube 3820. In addition, the treating liquid 82 used to treat the substrate W is introduced into the drain space 1252 through the space between the inner cup 1240 and the outer cup 1220 and thereafter drained outside the treating vessel 1200 through the drain tube 1250.

The air flow 84 released from the air-flow guide duct 3700 and the separate exhaust tube 3820 is introduced into the air-flow introduction part 3842 of the integrated exhaust tube 3840. Thereafter, the treating liquid 82 is separated by the gas-liquid separator 3846, and the air flow 84 is released to the outside through the air-flow discharge part 3844.

According to the embodiment of FIG. 19, part of the air flow 84 is introduced into the air-flow guide duct 3700. At this time, the air flow 84 flowing toward the outside of the substrate W by the centrifugal force may be smoothly introduced into the air-flow guide duct 3700 without collision or interference with the inner wall 1224 of the treating vessel 1200 or another member in the treating vessel 1200 because the air-flow guide duct 3700 is provided such that the air flow 84 is introduced into the air-flow guide duct 3700 in the tangential direction with respect to the rotating direction of the substrate W.

Furthermore, part of the air flow 84 is introduced into the exhaust space 1248 in the treating vessel 1200. However, the amount of air flow 84 introduced into the exhaust space 1248 is very small, as compared with when the air-flow guide duct 3700 is not provided. Accordingly, the air flow 84 introduced into the exhaust space 1248 may less collide or interfere with an external member and thus may be smoothly released without a vortex or a big collision.

In the above-described embodiment, it has been described that the air flow 84 supplied to the substrate W flows into the exhaust space 1248, which is located under the support plate 1420, along the first path and flows into the air-flow guide duct 3700 along the second path. However, the substrate treating apparatus 3000 may be configured such that all of the air flow 84 supplied to the substrate W flows along only the second path.

Figure 24A:
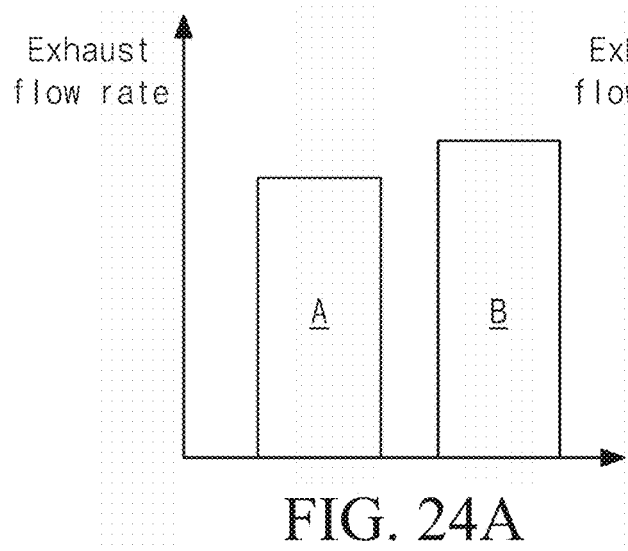
FIGS. 24A and 24B are graphs depicting exhaust flow rates of the substrate treating apparatus having the conventional structure illustrated in FIG. 1 and a substrate treating apparatus equipped with an air-flow guide duct as in the embodiments of the inventive concept.
Figure 24B:
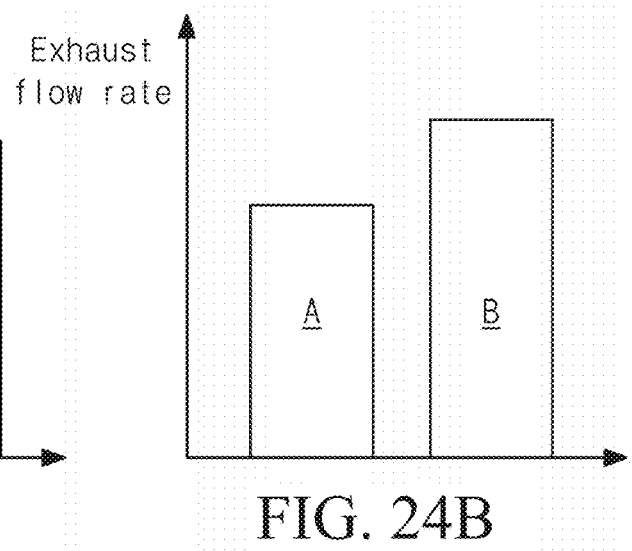

FIGS. 24A and 24B are graphs depicting exhaust flow rates of the substrate treating apparatus having the conventional structure illustrated in FIG. 1 and a substrate treating apparatus equipped with an air-flow guide duct as in the embodiments of the inventive concept. FIG. 24A is a graph depicting exhaust flow rates of the substrate treating apparatus in the related art and the substrate treating apparatus of the inventive concept when a substrate W is rotated at low speed, and FIG. 24B is a graph depicting exhaust flow rates of the substrate treating apparatus in the related art and the substrate treating apparatus of the inventive concept when the substrate W is rotated at high speed.

In FIGS. 24A and 24B, the substrate treating apparatus of the inventive concept is the substrate treating apparatus illustrated in FIG. 20. In FIG. 24A, the substrate W was rotated at 2500 RPM, and in FIG. 24B, the substrate W was rotated at 5000 RPM.

Referring to FIG. 24A, when the substrate W was rotated at 2500 RPM, the exhaust flow rate of the substrate treating apparatus A of FIG. 1 was 1257 LPM. However, the exhaust flow rate of the substrate treating apparatus B of the inventive concept was increased to 1418 LMP by about 12%. Referring to FIG. 24B, when the substrate W was rotated at 5000 RPM, the exhaust flow rate of the substrate treating apparatus A of FIG. 1 was 1114 LPM. However, the exhaust flow rate of the substrate treating apparatus B of the inventive concept was increased to 1468 LMP by about 35%.

Through FIGS. 24A and 24B, it can be seen that the exhaust efficiency is increased by the air-flow guide duct, which suctions the air flow 84 in the tangential direction with respect to the rotating direction of the substrate W, not only when the process is performed while the substrate W is rotated at low speed but also when the process is performed while the substrate W is rotated at high speed, and as the rotating speed of the substrate W is increased, the exhaust efficiency is further increased.

Although it has been described that the treating vessel includes the outer cup and the inner cup and the exhaust space in the inner space of the treating vessel is defined by the inner cup, the treating vessel may not include the inner cup, and the exhaust space in the inner space of the treating vessel may be defined as the area under the support plate that supports the substrate W.

Figure 25:
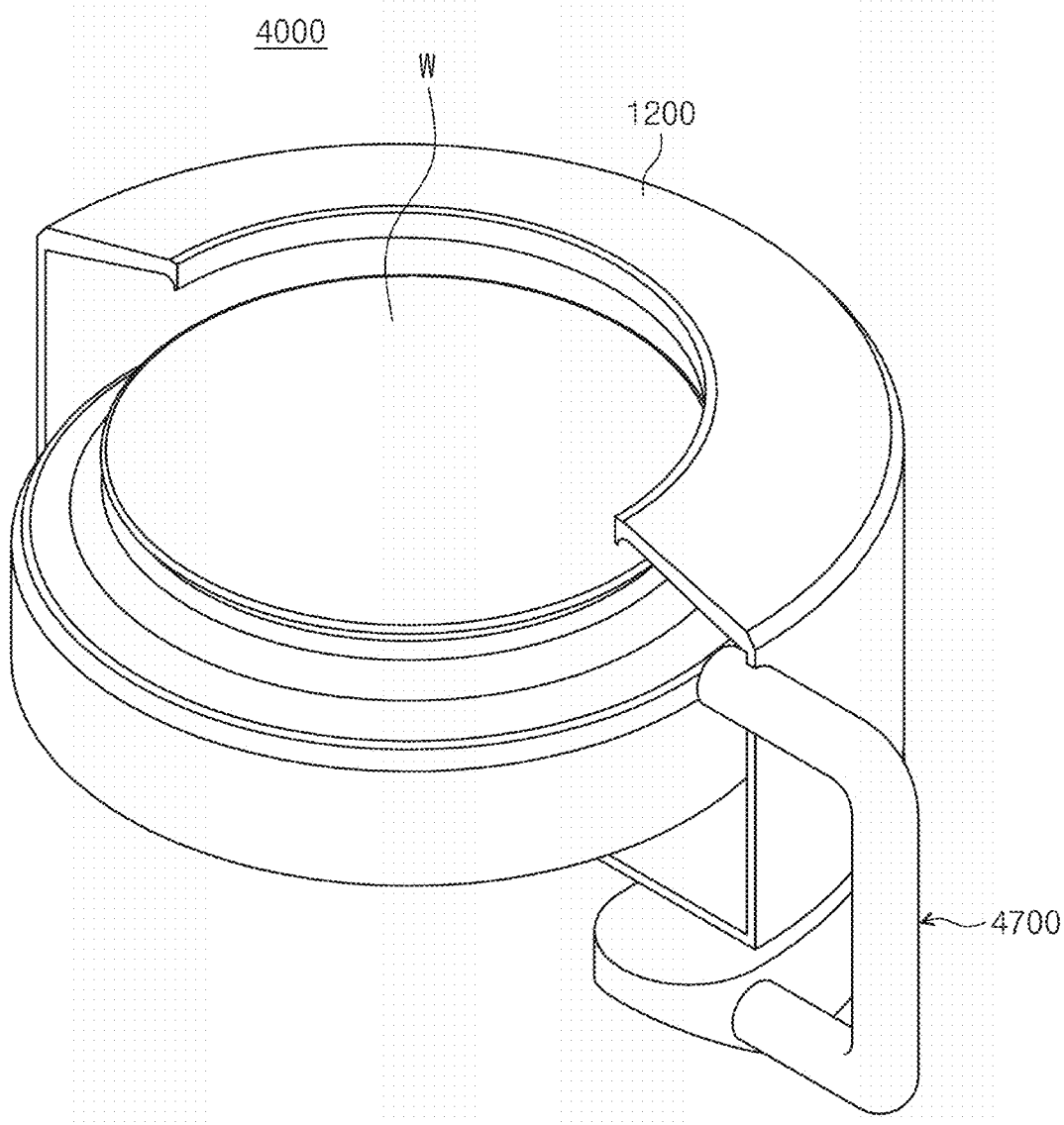
FIG. 25 is a perspective view of a substrate treating apparatus according to another embodiment of the inventive concept.

Although it has been described that the air flow is introduced into the air-flow guide duct in the tangential direction with respect to the rotating direction of the substrate W, the air-flow guide duct may be provided such that the air flow is introduced into the air-flow guide duct in a direction different from the tangential direction with respect to the rotating direction of the substrate W. For example, as illustrated in FIG. 25, an air-flow guide duct 4700 may be provided such that an inlet thereof is disposed at the same height as a substrate W or at a height adjacent to the substrate W and an air flow is introduced into the air-flow guide duct 4700 in the radial direction of the substrate W.

According to the embodiments of the inventive concept, the substrate treating apparatuses may smoothly release an air flow in the inner space of the treating vessel when treating a substrate by dispensing a treating liquid onto the rotating substrate in the inner space of the treating vessel.

Furthermore, according to the embodiments of the inventive concept, the substrate treating apparatuses may form a liquid film having a uniform thickness on the entire region of a substrate by dispensing a treating liquid onto the rotating substrate.

In addition, according to the embodiments of the inventive concept, the substrate treating apparatuses may prevent re-adsorption of contaminants to a substrate when treating the substrate by dispensing a treating liquid onto the rotating substrate.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a treating vessel having an inner space;
   a support unit configured to support and rotate the substrate in the inner space; and
   an exhaust unit configured to release an air flow in the inner space,
      wherein the exhaust unit includes an air-flow guide duct into which the air flow is introduced in a tangential direction with respect to a rotating direction of the substrate supported on the support unit,
      wherein the air-flow guide duct is helical shaped and is arranged around the support unit, such that the air-flow guide duct surrounds the support unit at least once,
      wherein at least a portion of the air-flow guide duct is defined by a guide plate,
      wherein the guide plate includes an inner edge and an outer edge, the inner edge being closer to a rotary shaft of the support unit than the outer edge, the guide plate having a downward incline from the inner edge to the outer edge.

2. The apparatus of claim 1, wherein the air-flow guide duct gradually lowered in height from an inlet to an outlet thereof around and along an axis of rotation of the substrate while maintaining the same distance from the axis of rotation of the substrate.

3. The apparatus of claim 1, wherein the support unit includes:
a support plate configured to support the substrate;
a rotary shaft configured to rotate the support plate; and
an actuator coupled to the rotary shaft and configured to provide torque to the rotary shaft,
wherein the treating vessel includes:
an outer cup configured to provide the inner space; and
an inner cup disposed in the inner space so as to be spaced apart from the outer cup, the inner cup being configured to surround the rotary shaft or the actuator, and
wherein the air-flow guide duct is provided between the outer cup and the inner cup.

4. The apparatus of claim 3, wherein the guide plate in a helical shape is provided between the outer cup and the inner cup, and
wherein the air-flow guide duct is defined by the outer cup, the inner cup, and the guide plate.

5. The apparatus of claim 4,
wherein a liquid-drain hole is formed in a region of the guide plate that is closer to the outer edge than the inner edge and adjacent to the outer cup such that the guide plate is configured to guide a liquid away from the inner space along the downward incline to the liquid-drain hole.

6. The apparatus of claim 3, wherein the inner cup defines, in the inner space, an exhaust space to which an exhaust tube is coupled, and
wherein the air flow flowing out of the air-flow guide duct is introduced into the exhaust space and released from the treating vessel.

7. The apparatus of claim 6, wherein a gas-liquid separator extending upward from a bottom wall of the outer cup is provided between the outer cup and the inner cup, and
wherein the air-flow guide duct releases the air flow into a space between the outer cup and the gas-liquid separator.

8. An apparatus for treating a substrate, the apparatus comprising:
a treating vessel having an inner space;
a support unit having a support plate configured to support and rotate the substrate in the inner space; and
an air-flow guide duct configured to guide a flow direction of an air flow flowing outside the substrate by rotation of the substrate supported on the support plate,
wherein an inlet of the air-flow guide duct through which the air flow is introduced is provided at the same height as the substrate supported on the support plate or at a height adjacent to the substrate supported on the support plate, and
wherein the air-flow guide duct is helical shaped and is arranged around the support unit, such that the air-flow guide duct surrounds the support unit at least once,
wherein at least a portion of the air-flow guide duct is defined by a guide plate,
wherein the guide plate includes an inner edge and an outer edge, the inner edge being closer to a rotary shaft of the support unit than the outer edge, the guide plate having a downward incline from the inner edge to the outer edge.

* * * * *